US012622260B2

(12) United States Patent
Mazza et al.

(10) Patent No.: US 12,622,260 B2
(45) Date of Patent: May 5, 2026

(54) BOTTOM CONTACT JUMPERS FOR STACKED FIELD EFFECT TRANSISTOR SEMICONDUCTORS

(71) Applicant: International Business Machines Corporation, Armonk, NY (US)

(72) Inventors: James P Mazza, Saratoga Springs, NY (US); Koichi Motoyama, Clifton Park, NY (US); Nicholas Anthony Lanzillo, Wynantskill, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 18/469,836

(22) Filed: Sep. 19, 2023

(65) Prior Publication Data

US 2025/0096128 A1     Mar. 20, 2025

(51) Int. Cl.
| | |
|---|---|
| *H10W 20/43* | (2026.01) |
| *H10D 30/43* | (2025.01) |
| *H10D 30/67* | (2025.01) |
| *H10D 62/10* | (2025.01) |
| *H10D 64/23* | (2025.01) |
| *H10D 84/83* | (2025.01) |

(52) U.S. Cl.
CPC ............ *H10W 20/43* (2026.01); *H10D 30/43* (2025.01); *H10D 30/6735* (2025.01); *H10D 30/6757* (2025.01); *H10D 62/121* (2025.01); *H10D 64/251* (2025.01); *H10D 84/83* (2025.01)

(58) Field of Classification Search
CPC ........... H10D 30/6757; H10D 30/6735; H10D 62/121; H10D 64/251
See application file for complete search history.

(56) References Cited

U.S. PATENT DOCUMENTS

| | | | |
|---|---|---|---|
| 9,659,963 B2 | 5/2017 | Cheng | |
| 9,837,414 B1 | 12/2017 | Balakrishnan | |
| 9,947,590 B1 | 4/2018 | Pritchard | |
| 9,997,598 B2 | 6/2018 | Smith | |
| 10,163,879 B2 | 12/2018 | Jung | |
| 10,163,897 B2 | 12/2018 | Lin | |
| 10,192,819 B1 * | 1/2019 | Chanemougame ... | H10W 20/40 |
| 10,192,867 B1 * | 1/2019 | Frougier ............... | H10D 84/85 |

(Continued)

*Primary Examiner* — Steven M Page
(74) *Attorney, Agent, or Firm* — Anthony Curro

(57) ABSTRACT

Embodiments are disclosed for a semiconductor structure. The semiconductor structure includes a stacked field effect transistor (FET) including a top FET and a bottom FET. Additionally, the semiconductor structure includes a bottom source/drain (S/D) contact jumper connection within a gate cut region. The gate cut includes a liner spacer and a dielectric fill within the first liner spacer. Additionally, the bottom S/D contact jumper is within the dielectric fill. The semiconductor structure further includes a top S/D contact fly-over over a bottom S/D contact in contact with the bottom S/D contact jumper. Additionally, the semiconductor structure includes a top S/D access metal track over the bottom S/D contact, through the top S/D contact. Further, the semiconductor structure includes a recessed gate cut liner facing the top S/D contact fly-over. Additionally, the semiconductor structure includes a non-recessed gate cut liner facing a non-fly-over top S/D contact.

20 Claims, 21 Drawing Sheets

(56)         References Cited

U.S. PATENT DOCUMENTS

| | | | |
|---|---|---|---|
| 10,756,096 | B2 | 8/2020 | Paul |
| 11,069,684 | B1 * | 7/2021 | Xie ........................ H10D 84/85 |
| 11,107,752 | B2 | 8/2021 | Zhang |
| 11,488,947 | B2 | 11/2022 | Liebmann |
| 11,495,540 | B2 | 11/2022 | Liebmann |
| 2015/0137249 | A1 | 5/2015 | Lin |
| 2016/0380002 | A1 | 12/2016 | Cheng |
| 2017/0098641 | A1 | 4/2017 | Jung |
| 2018/0040695 | A1 | 2/2018 | Smith |
| 2018/0108571 | A1 | 4/2018 | Pritchard |
| 2019/0148376 | A1 * | 5/2019 | Chanemougame .......................... H10D 30/6219 257/532 |
| 2020/0111798 | A1 * | 4/2020 | Paul ..................... H10B 10/125 |
| 2021/0035967 | A1 | 2/2021 | Liebmann |
| 2021/0118799 | A1 | 4/2021 | Liebmann |
| 2021/0210413 | A1 | 7/2021 | Zhang |
| 2021/0265348 | A1 * | 8/2021 | Xie ..................... H10D 64/015 |
| 2022/0367453 | A1 * | 11/2022 | Kim ..................... H10D 64/017 |
| 2023/0054540 | A1 | 2/2023 | Xie |
| 2023/0402519 | A1 * | 12/2023 | Anderson .......... H10D 84/0149 |
| 2023/0411242 | A1 * | 12/2023 | Lin ................... H10D 30/6735 |

* cited by examiner

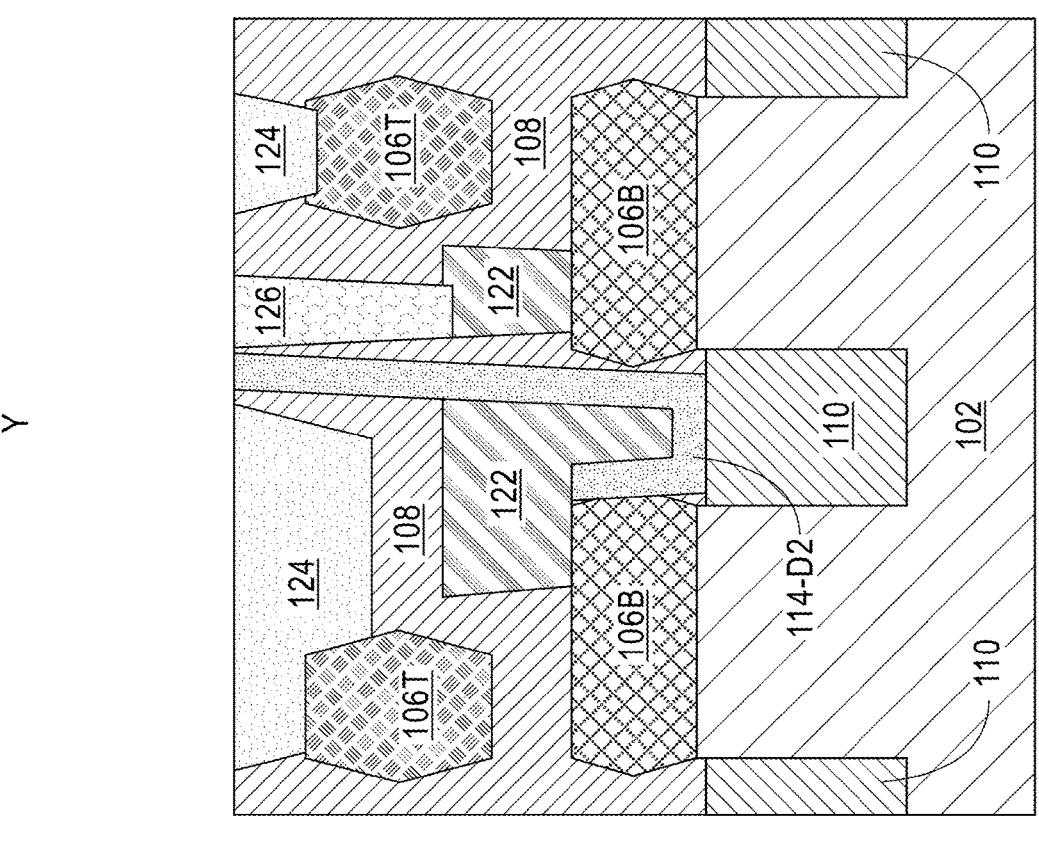
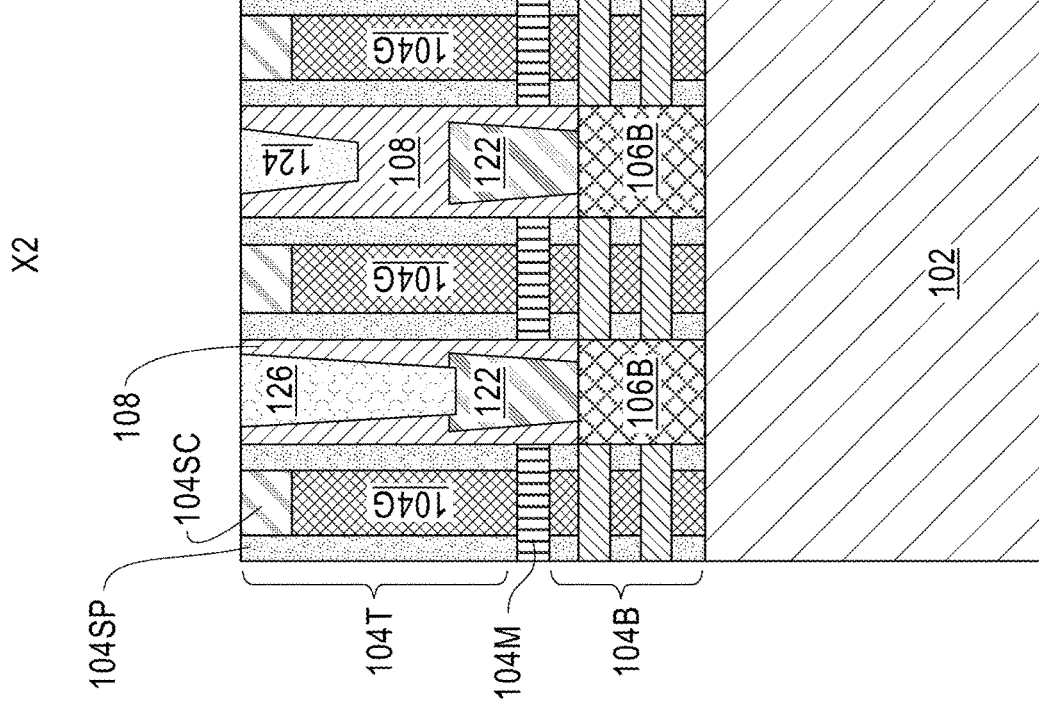
FIG. 1-8B

400~

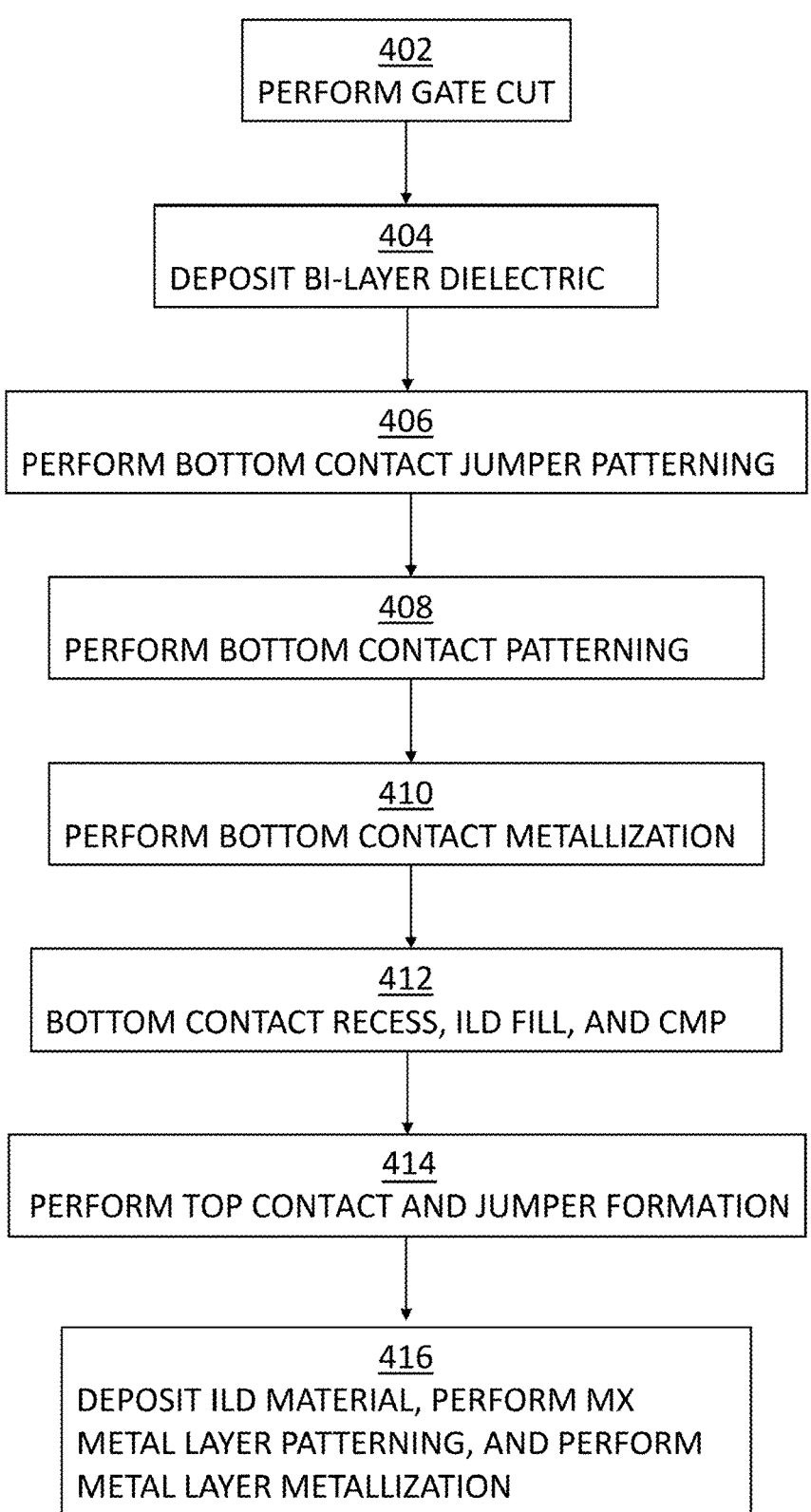

```
┌─────────────────────────────┐
│            402              │
│      PERFORM GATE CUT       │
└─────────────────────────────┘
              │
              ▼
┌─────────────────────────────┐
│            404              │
│  DEPOSIT BI-LAYER DIELECTRIC│
└─────────────────────────────┘
              │
              ▼
┌──────────────────────────────────────────┐
│                  406                       │
│ PERFORM BOTTOM CONTACT JUMPER PATTERNING   │
└──────────────────────────────────────────┘
              │
              ▼
┌──────────────────────────────────────────┐
│                  408                       │
│    PERFORM BOTTOM CONTACT PATTERNING       │
└──────────────────────────────────────────┘
              │
              ▼
┌──────────────────────────────────────────┐
│                  410                       │
│   PERFORM BOTTOM CONTACT METALLIZATION     │
└──────────────────────────────────────────┘
              │
              ▼
┌──────────────────────────────────────────┐
│                  412                       │
│  BOTTOM CONTACT RECESS, ILD FILL, AND CMP  │
└──────────────────────────────────────────┘
              │
              ▼
┌──────────────────────────────────────────┐
│                  414                       │
│  PERFORM TOP CONTACT AND JUMPER FORMATION  │
└──────────────────────────────────────────┘
              │
              ▼
┌──────────────────────────────────────────┐
│                  416                       │
│      DEPOSIT ILD MATERIAL, PERFORM MX      │
│   METAL LAYER PATTERNING, AND PERFORM      │
│       METAL LAYER METALLIZATION            │
└──────────────────────────────────────────┘
```

FIG. 4

BOTTOM CONTACT JUMPERS FOR STACKED FIELD EFFECT TRANSISTOR SEMICONDUCTORS

BACKGROUND

The present invention generally relates to semiconductor structures, and more particularly to bottom contact jumpers in stacked field effect transistor (FET) semiconductor structures.

Integrated circuit (IC) chips are formed on semiconductor wafers at increasingly smaller scale. In current technology nodes, such as 7, 10 and 14 nanometer technologies, transistor devices are constructed as three-dimensional (3D) fin FET (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate all around technology. One example of a complex gate all around technology is a stacked FET where nFET and pFET nanowires/nanosheets are vertically stacked on top of each other.

In a stacked FET semiconductor, the bottom contacts are in contact with the bottom source/drain (S/D) epitaxial, which is in contact with the bottom FET of the stacked FET. However, in the stacked FET semiconductor, the bottom contacts can create middle of line (MOL) congestion. The MOL congestion can decrease the effectiveness of pin access, and constrain intra-cell routing.

SUMMARY

Embodiments are disclosed for a semiconductor structure. The semiconductor structure includes a stacked field effect transistor (FET) including a top FET and a bottom FET. Additionally, the semiconductor structure includes a bottom source/drain (S/D) contact jumper connection within a gate cut region. The gate cut includes a liner spacer and a dielectric fill within the first liner spacer. Additionally, the bottom S/D contact jumper is within the dielectric fill. The semiconductor structure further includes a top S/D contact fly-over over a bottom S/D contact in contact with the bottom S/D contact jumper. Additionally, the semiconductor structure includes a top S/D access metal track over the bottom S/D contact, through the top S/D contact. Further, the semiconductor structure includes a recessed gate cut liner facing the top S/D contact fly-over. Additionally, the semiconductor structure includes a non-recessed gate cut liner facing a non-fly-over top S/D contact.

Embodiments are disclosed for a method of fabricating a semiconductor structure. The method includes forming a top FET having a top gate, over a bottom FET comprising a bottom gate. The top FET is in contact with an S/D epitaxial. Further, the bottom FET is in contact with a bottom S/D epitaxial. The method also includes forming a cut region at a boundary to a cell comprising the top FET and bottom FET. Additionally, the method includes forming a first liner spacer in the cut region. Further, the method includes performing a dielectric fill in the first liner spacer. Additionally, the method includes forming a bottom S/D contact jumper in the dielectric fill. Further, the method includes forming a bottom S/D contact with a contact recess. Additionally, the method includes forming a top S/D contact fly-over over the bottom S/D contact, wherein the bottom S/D contact is in contact with the bottom S/D contact jumper.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

FIG. 1-1B is cross-sectional views of semiconductor structures during intermediate steps of a method for forming bottom contact jumpers of stacked field effect transistor (FET) semiconductors, in accordance with some embodiments of the present disclosure.

FIG. 1-2A is a top view and a cross-sectional view of semiconductor structures during intermediate steps of a method for forming bottom contact jumpers of stacked FET semiconductors, in accordance with some embodiments of the present disclosure.

FIG. 1-2B is cross-sectional views of semiconductor structures during intermediate steps of a method for forming bottom contact jumpers of stacked FET semiconductors, in accordance with some embodiments of the present disclosure.

FIG. 1-3A is a top view and cross-sectional view of semiconductor structures during intermediate steps of a method for forming bottom contact jumpers of stacked FET semiconductors, in accordance with some embodiments of the present disclosure.

FIG. 1-3B is cross-sectional views of semiconductor structures during intermediate steps of a method for forming bottom contact jumpers of stacked FET semiconductors, in accordance with some embodiments of the present disclosure.

FIG. 1-4A is a top view and cross-sectional view of semiconductor structures during intermediate steps of a method for forming bottom contact jumpers of stacked FET semiconductors, in accordance with some embodiments of the present disclosure.

FIG. 1-4B is cross-sectional views semiconductor structures during intermediate steps of a method for forming bottom contact jumpers of stacked FET semiconductors, in accordance with some embodiments of the present disclosure.

FIG. 1-5A is a top view and cross-sectional view of semiconductor structures during intermediate steps of a method for forming bottom contact jumpers of stacked FET semiconductors, in accordance with some embodiments of the present disclosure.

FIG. 1-5B is cross-sectional views of semiconductor structures during intermediate steps of a method for forming bottom contact jumpers of stacked FET semiconductors, in accordance with some embodiments of the present disclosure.

FIG. 1-6A is a top view and cross-sectional view of semiconductor structures during intermediate steps of a method for forming bottom contact jumpers of stacked FET semiconductors, in accordance with some embodiments of the present disclosure.

FIG. 1-6B is cross-sectional views of semiconductor structures during intermediate steps of a method for forming bottom contact jumpers of stacked FET semiconductors, in accordance with some embodiments of the present disclosure.

FIG. 1-7A is a top view and cross-sectional view of semiconductor structures during intermediate steps of a method for forming bottom contact jumpers of stacked FET semiconductors, in accordance with some embodiments of the present disclosure.

FIG. 1-7B is cross-sectional views of semiconductor structures during intermediate steps of a method for forming bottom contact jumpers of stacked FET semiconductors, in accordance with some embodiments of the present disclosure.

FIG. 1-8A is a top view and cross-sectional views of semiconductor structures during intermediate steps of a method for forming bottom contact jumpers of stacked FET semiconductors, in accordance with some embodiments of the present disclosure.

FIG. 1-8B is cross-sectional views of semiconductor structures during intermediate steps of a method for forming bottom contact jumpers of stacked FET semiconductors, in accordance with some embodiments of the present disclosure.

FIG. 1-9A is a top view and cross-sectional view of semiconductor structures during intermediate steps of a method for forming bottom contact jumpers of stacked FET semiconductors, in accordance with some embodiments of the present disclosure.

FIG. 1-9B is cross-sectional views of semiconductor structures during intermediate steps of a method for forming bottom contact jumpers of stacked FET semiconductors, in accordance with some embodiments of the present disclosure.

FIG. 2 is a top view of semiconductor structures having bottom contact jumpers of stacked FET semiconductors, in accordance with some embodiments of the present disclosure.

FIG. 3 is a top view of semiconductor structures having bottom contact jumpers of stacked FET semiconductors, in accordance with some embodiments of the present disclosure.

FIG. 4 is a process flow chart of a method for forming bottom contact jumpers of stacked FET semiconductors, in accordance with some embodiments of the present disclosure.

Figures 1, 1A:
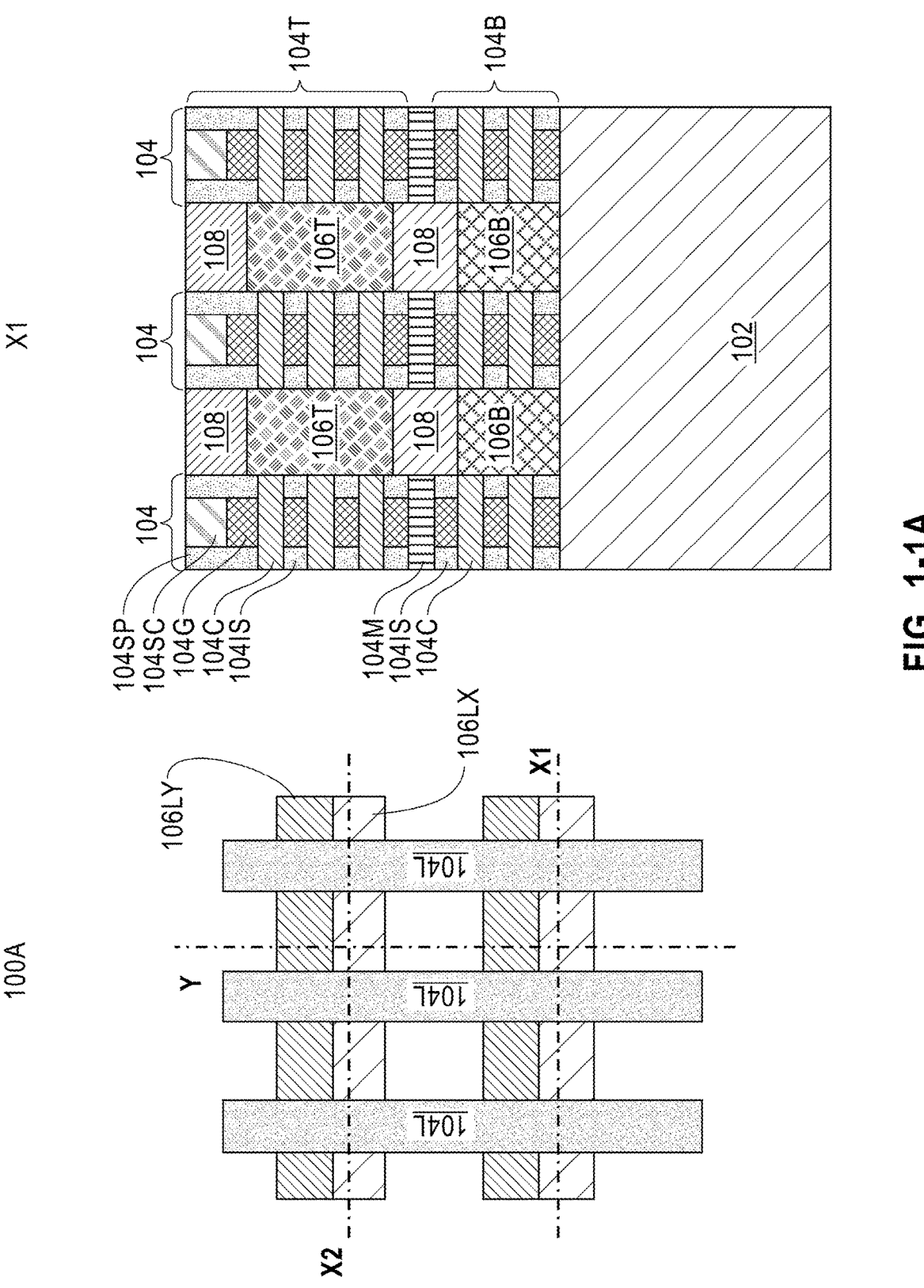
FIG. 1-1A is a top view and a cross-sectional view of semiconductor structures during intermediate steps of a method for forming bottom contact jumpers of stacked field effect transistor (FET) semiconductors, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the example embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub lithographic" may refer to a dimension or size less than current dimensions achievable by photolithographic processes, and the term "lithographic" may refer to a dimension or size equal to or greater than current dimensions achievable by photolithographic processes. The sub lithographic and lithographic dimensions may be determined by a person of ordinary skill in the art at the time the application is filed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

In a stacked FET semiconductor, the bottom contacts are in contact with the bottom source/drain (S/D) epitaxial, which is in contact with the bottom FET of the stacked FET. However, in the stacked FET semiconductor, the bottom contacts can create middle of line (MOL) congestion. The MOL congestion can decrease the effectiveness of pin access, and constrain intra-cell routing.

Accordingly, some embodiments of the present disclosure provide a semiconductor structure having top contacts over a bottom contact jumper. In this way, some embodiments of the present disclosure may provide improved pin access efficiency and provide more flexibility for intra-cell routing. Pin access refers to the ability for global routes to connect to standard cell input and output pins. The higher the number of legal locations for a global route to connect to a pin, the better the accessibility is for that pin. Additionally, intra-cell routing refers to all the connections inside of a standard cell as opposed to global routing which refers to connections made between two separate standard cells. Further, such embodiments provide flexibility by enabling certain intra-cell and inter-cell connections to be made on middle of line (MOL) layers as opposed to back end of line (BEOL) layers (e.g., M1, M2, and the like). By removing some of the BEOL shapes that would be used for connections in various prior art, the free routing resources can be used for pin accessibility within the cell. In this way, such embodiments can improve the operation of computer technology. However, some embodiments of the present disclosure may not achieve such advantages.

FIGS. 1-1A, 1-1B through 1-9A, 1-9B are top views 100A and cross-sectional views X1, X2, Y of example semiconductor structures produced by a fabrication process for forming bottom contact jumpers of stacked FET semiconductors, in accordance with some embodiments of the present disclosure. For clarity, not all elements are labelled in these figures. Rather, representative elements are labelled, with similar elements being indicated by position, size, shape, hash lines (or lack thereof), and the like, in subsequent figures.

FIG. 1-1A is a top view 100A and cross-sectional view X1 of semiconductor structure during intermediate steps of a method for forming bottom contact jumpers of stacked FET semiconductors, in accordance with some embodiments of the present disclosure. The top view 100A includes device layers 104L and gate layers 106L. The device layers 104L represent the layers of the semiconductor structure having stacked FET devices (e.g., stacked FETs 104, shown in view X1). Further, the gate layers 106L represent the layers having the gates to the stacked FETs 104 (e.g., top S/D epitaxials 106T and bottom S/D epitaxials 106B, shown in view X1). Additionally, the top view 100A includes cut lines X1, X2, and Y. The cut lines X1, X2, and Y correlate to the cross-sectional views X1, X2, and Y, of the semiconductor structure, which show cross-sections along the X1, X2, and Y cut lines. The gate layers 106L include an X portion 106LX and a Y portion 106LY. The X portion 106LX includes the portion of the gate layer 106L through which the X1 and X2 cut lines cut. Similarly, the Y portion 106LY includes the portion of the gate layer 106L through which the Y cut line cuts.

The semiconductor structure in FIG. 1-1A may result from a fabrication method wherein materials constituting each of the elements is deposited, applied, and otherwise arranged as shown. More specifically, the semiconductor structure of FIG. 1-1A shows the semiconductor structure after stacked FET front end of line (FEOL) processing. The processes and formation of structures during FEOL processing is not within the scope of this disclosure and may be performed using known methods and techniques. As shown in view X1, the semiconductor structure includes a substrate 102, stacked FET 104, top S/D epitaxial (epi) 106T, bottom S/D epitaxial 106B, and interlayer dielectric (ILD) 108. Herein, the top S/D epitaxial 106T and bottom S/D epitaxial 106B are referred to collectively as S/D epitaxials 106.

The substrate 102 can be a semiconductor or an insulator with an active surface semiconductor layer. The substrate 102 can be crystalline, semi-crystalline, microcrystalline, or amorphous. The substrate 102 can be (except for contaminants) a single element (e.g., Si), primarily (e.g., with doping) of a single element, for example, Si or Ge. The substrate 102 can include a compound, for example, aluminum oxide (Al2O3), silicon dioxide (SiO2), gallium arsenide (GaAs), silicon carbide (SiC), or SiGe. The substrate 102 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 102 can also have other layers forming the substrate 102, including high-k oxides and/or nitrides. In one or more embodiments, the substrate 102 can be a silicon wafer. In an embodiment, the substrate 102 can be a single crystal silicon wafer.

The stacked FET 104 includes top FET 104T, bottom FET 104B, channels 104C, high-k metal gate (HKMG) 104G, middle dielectric isolation (MDI) layer 104M, spacers 104SP, inner spacers 104IS, and sacrificial cap 104SC. The channels 104C can include nanosheets of semiconductor material, which can be conductive in a transistor, "on" state, or highly resistive in a transistor, "off" state. The conductivity can be controlled by the HKMG 104G. The sacrificial cap 104SC can provide a protective layer over the HKMG 104G of the top FET 104T. The MDI layer 104M can isolate the top FET 104T and the bottom FET 104B. The spacers

104SP can represent a dielectric material that provides a spacing between the HK/MGs 104G and the ILD 108. The inner spacers 104IS can represent a dielectric material that provides a spacing between the HKMGs 104G and the S/D epitaxials 106.

Figures 1, 1B:
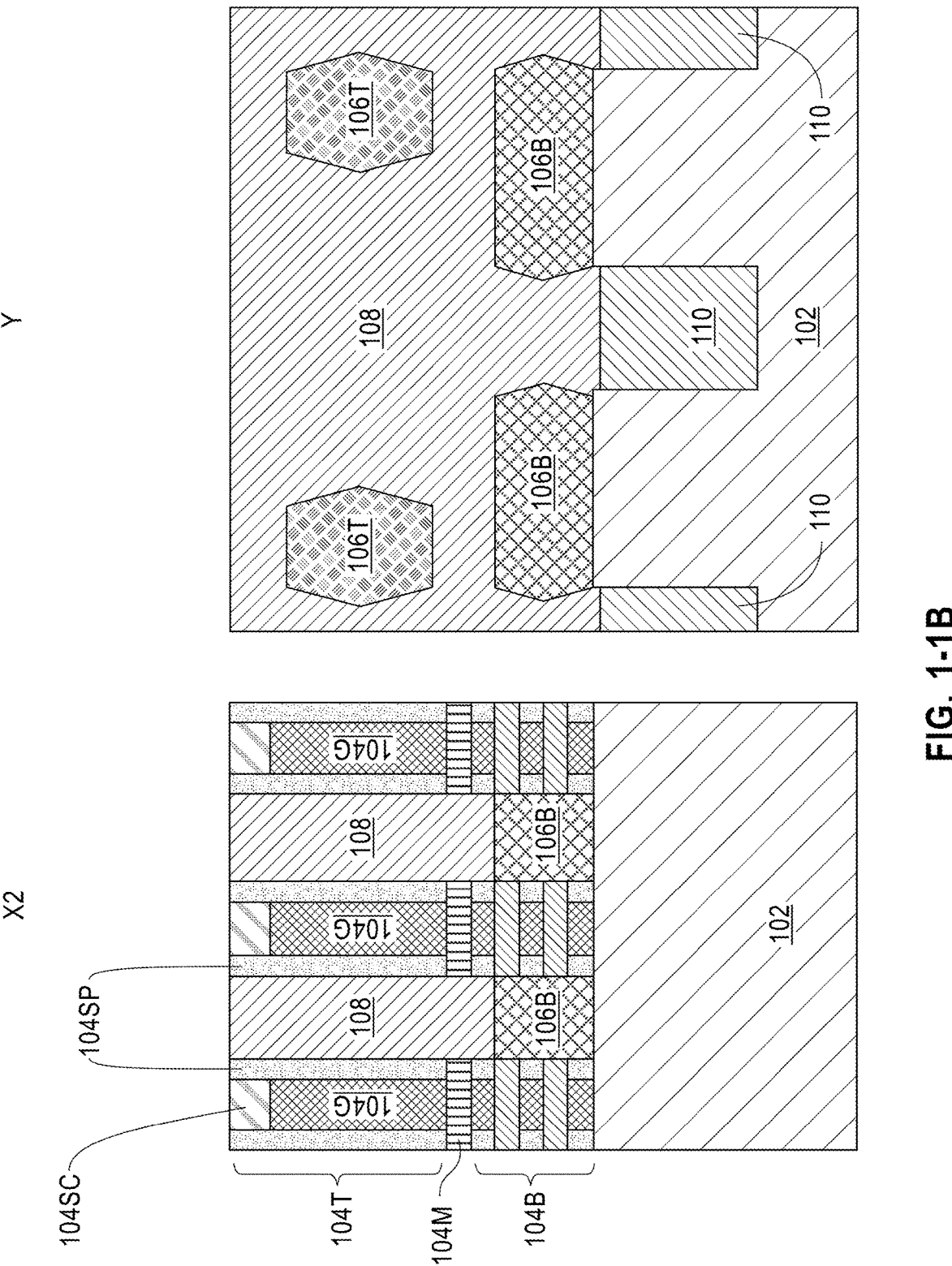

FIG. 1-1B is cross-sectional views X2, Y of a semiconductor structure during intermediate steps of a method for forming bottom contact jumpers of stacked FET semiconductors, in accordance with some embodiments of the present disclosure. Similar to FIG. 1-1A, the semiconductor structure of FIG. 1-1B shows the semiconductor structure after stacked FET front end of line (FEOL) processing. The views X2, Y include the same elements described with respect to view X1 of FIG. 1-1A. Additionally, the view Y includes shallow trench isolation (STI) layer 110. With respect to the view X2, the channels 104C are included in the bottom FET 104B but not the top FET. Additionally, view X2 includes the bottom S/D epitaxials 106B but not the top S/D epitaxials 106T. To clarify, the view X1 is a cross section through the top S/D epitaxial 106T and bottom S/D epitaxial 106B shown in view Y. In contrast, the view X2 is a cross section through the bottom S/D epitaxial 106B (shown in view Y). For these reasons, the top S/D epitaxial 106T is shown in view X1, but not view X2.

FIGS. 1-2A, 1-2B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from performing a gate cut on the semiconductor structure shown in FIGS. 1-1A, 1-1B. Performing a gate cut involves removing ILD 108 to form the trench 112.

FIGS. 1-3A, 1-3B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from depositing bi-layer dielectric material on the semiconductor structure shown in FIGS. 1-2A, 1-2B. Depositing bi-layer dielectric material involves depositing dielectric 114-D1 and dielectric 114-D2 in the trench 112. The dielectric 114-D1 can be a silicon oxide (SiO$_2$). Additionally, the dielectric 114-D2 can be silicon nitride (SiN). However, alternative materials may be used for the dielectrics 114-D1, 114-D2, such as, SiOC, SiC, SiOCN, SiBCN, AlOx, AlNx, and the like. A variety of materials may be used for dielectrics 114-D1, 114-D2, as long as they are insulating and they can be selectively etched separately.

FIGS. 1-4A, 1-4B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from performing bottom contact jumper patterning on the semiconductor structure shown in FIGS. 1-3A, 1-3B. Performing bottom contact jumper patterning involves depositing an organic planarization layer (OPL) 116 on the semiconductor structure shown in FIGS. 1-3A, 1-3B. Additionally, performing bottom contact jumper patterning involves removing portions of the OPL 116 and dielectric 114-D1 to form trench 118. According to some embodiments of the present disclosure, removing the OPL 116 and dielectric 114-D1 can involve a two-stage, self-aligned oxide reactive ion etching (RIE) process.

FIGS. 1-5A, 1-5B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from performing bottom contact patterning on the semiconductor structure shown in FIGS. 1-4A, 1-4B. Performing bottom contact patterning involves removing portions of the OPL 116, ILD 108, and dielectric 114-2 to form trenches 120-1, 120-2.

FIGS. 1-6A, 1-6B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from bottom contact metallization on the semiconductor structure shown in FIGS. 1-5A, 1-5B. Performing bottom contact metallization involves depositing metallic materials in the trenches 120-1, 120-2, to form bottom contact metals 122-1.

FIGS. 1-7A, 1-7B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from performing a bottom contact recess, ILD fill, and chemical mechanical planarization (CMP) on the semiconductor structure shown in FIGS. 1-6A, 1-6B. Performing the bottom contact recess involves removing material from the bottom contact metals 122-1, beneath a portion of the top S/D epitaxial 106T, to form bottom contacts 122. Additionally, performing the ILD fill involves depositing ILD 108 on the bottom contacts 122. Further, performing the CMP involves removing portions of the ILD fill to form a planarized surface for the ILD fill with the rest of the semiconductor structure.

FIGS. 1-8A, 1-8B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure results from forming top contact fly-over 124-FO, top contact non-fly-over 124, and bottom contact jumper (JU) 126 on the semiconductor structure shown in FIGS. 1-7A, 1-7B. The top contact fly-over 124-FO, top contact non-fly-over 124N are collectively referred to herein as top contacts 124. Forming the top contacts 124 and bottom contact jumper 126 involves removing ILD 108 to form trenches for holding the top contacts 126 and bottom contact jumper 126. Additionally, forming the top contacts 124 and bottom contact jumper 126 involves depositing a metallic material that constitutes the top contacts 124 and bottom contact jumper 126. The bottom contact jumper 126 TB is an MOL layer that connects the bottom contact 122 to the frontside of the semiconductor structure.

FIGS. 1-9A, 1-9B are the top view 100A and cross-sectional views X1, X2, Y of a semiconductor structure during intermediate steps of a method for forming bottom contact jumpers of stacked FET semiconductors, in accordance with some embodiments of the present disclosure. The semiconductor structure may result from depositing ILD material, performing Mx metal layer patterning, and performing metal layer metallization on the semiconductor structure shown in FIGS. 1-8A, 1-8B. Depositing ILD material may involve depositing a dielectric material to form the ILD 128. Additionally, performing Mx metal layer patterning can involve removing portions of the ILD 128 to form patterns for the metal lines and contacts. Further, performing the metal layer metallization can involve depositing metal material in the openings created by removing the ILD portions, to form the metal line M1 130, and vias 132.

Figures 1, 2, 2A:
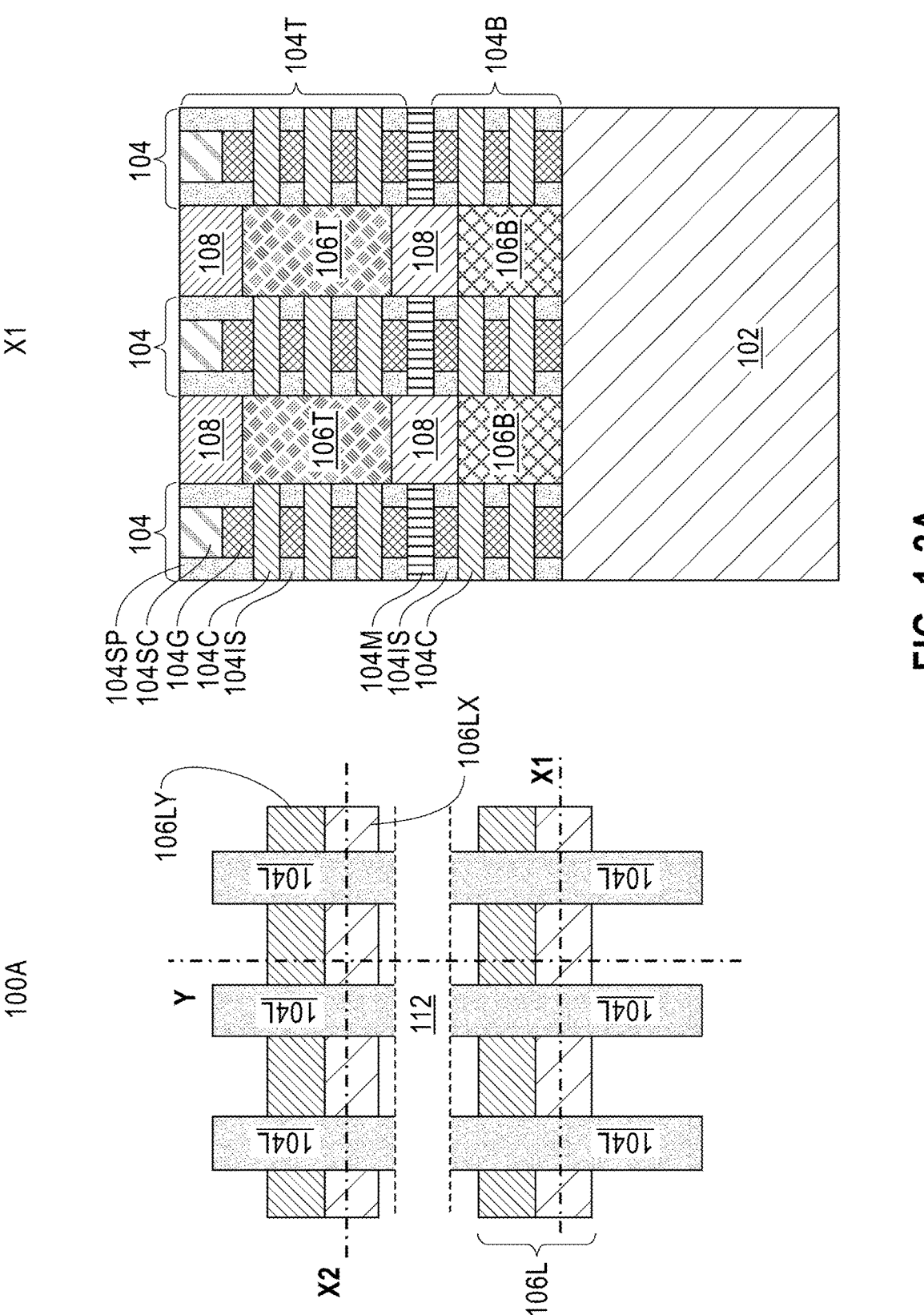
Figures 1, 2, 2B:
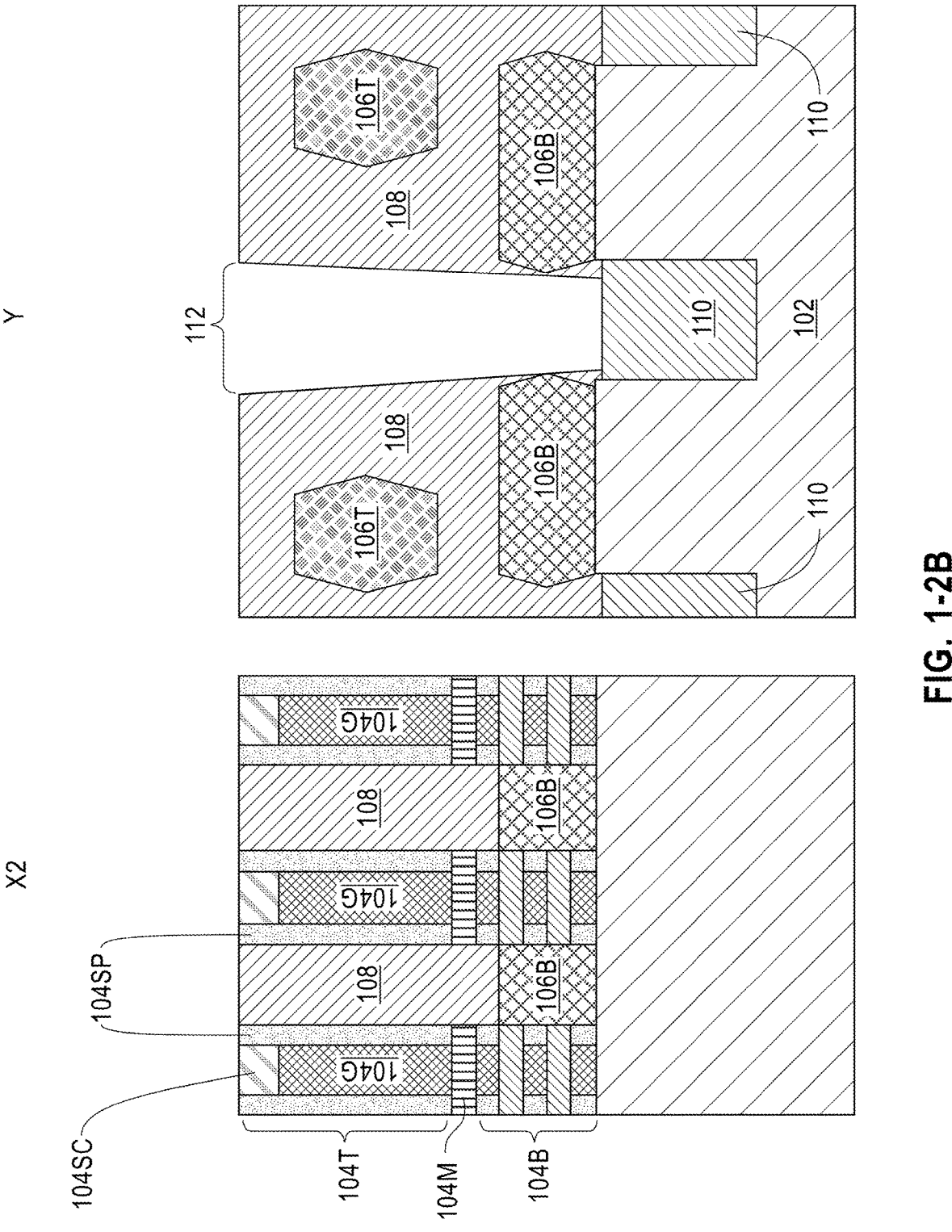

FIG. 2 is a top view of semiconductor structures 200-1, 200-2 having bottom contact jumpers of stacked FET semiconductors, in accordance with some embodiments of the present disclosure. The semiconductor structures 200-1, 200-2 are similar to the top views 100A of the semiconductor structure shown in FIGS. 1-9A, 1-9B. Accordingly, the semiconductor structures 200-1, 200-2 include device layers 104L, gate layers '06L, dielectrics 114-D1, 114-D2, top contacts 124, and bottom jumpers 126.

Further, in FIG. 2, semiconductor structures 200-1, 200-2 show potential intracell routings in accordance with some embodiments of the present disclosure. More specifically, the semiconductor structure 200-1 includes cells 202-1, 202-2, each having stacked FET structures (not shown). In the semiconductor structure 200-1, the contact fly-over 204 connects the bottom contact jumper (JU) of cell 202-1 to the bottom contact jumper (not shown) of cell 202-2.

Additionally, the semiconductor structure 200-2 includes cells 206-1, 206-2, each having stacked FET structures (not shown). In the semiconductor structure 200-2, the contact fly-over 208 connects the bottom contact jumper (JU) of cell 206-1 to the bottom contact jumper (not shown) of cell 206-2.

Figures 1, 2, 3, 3A:
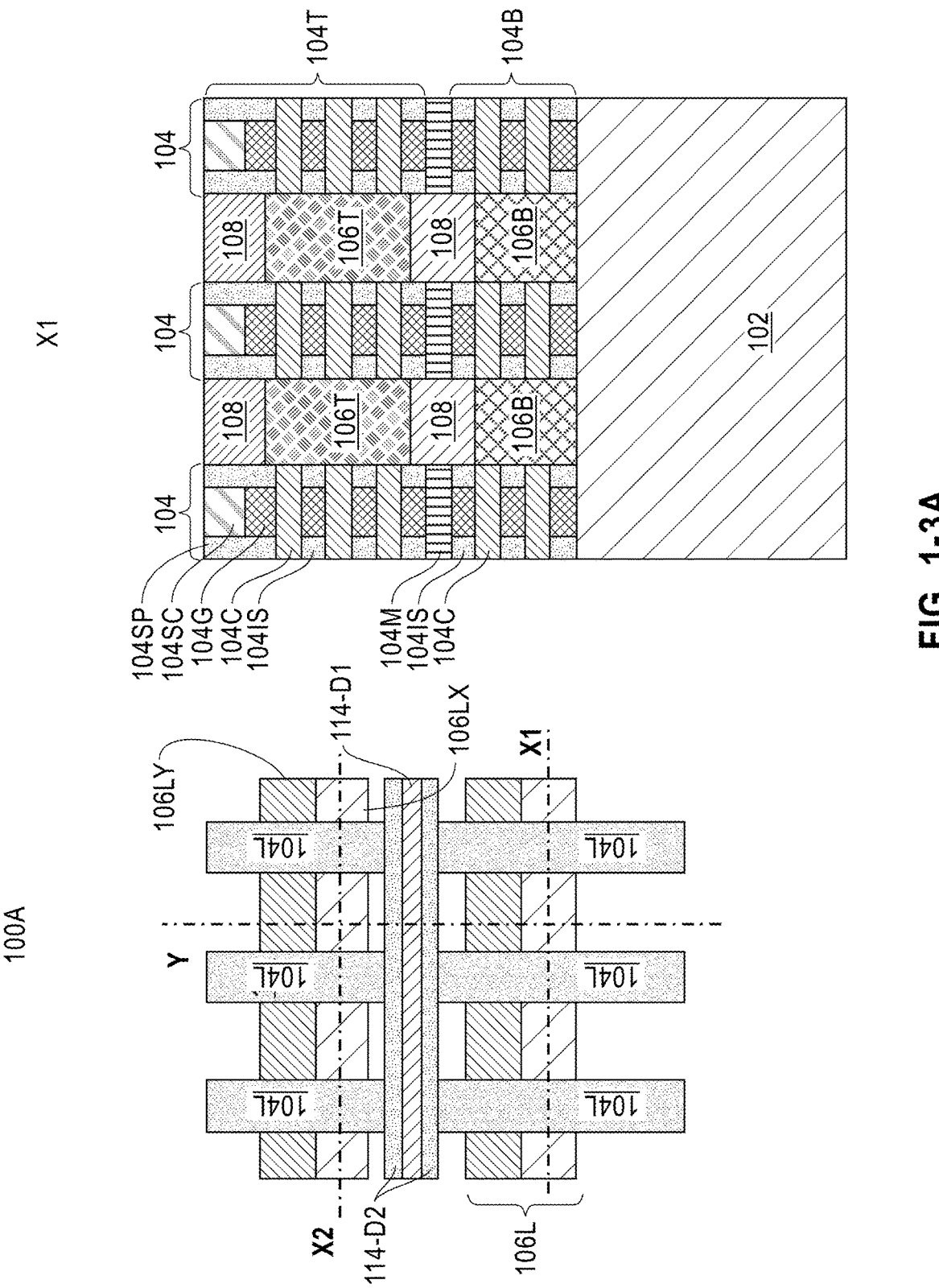
Figures 1, 2, 3, 3B:
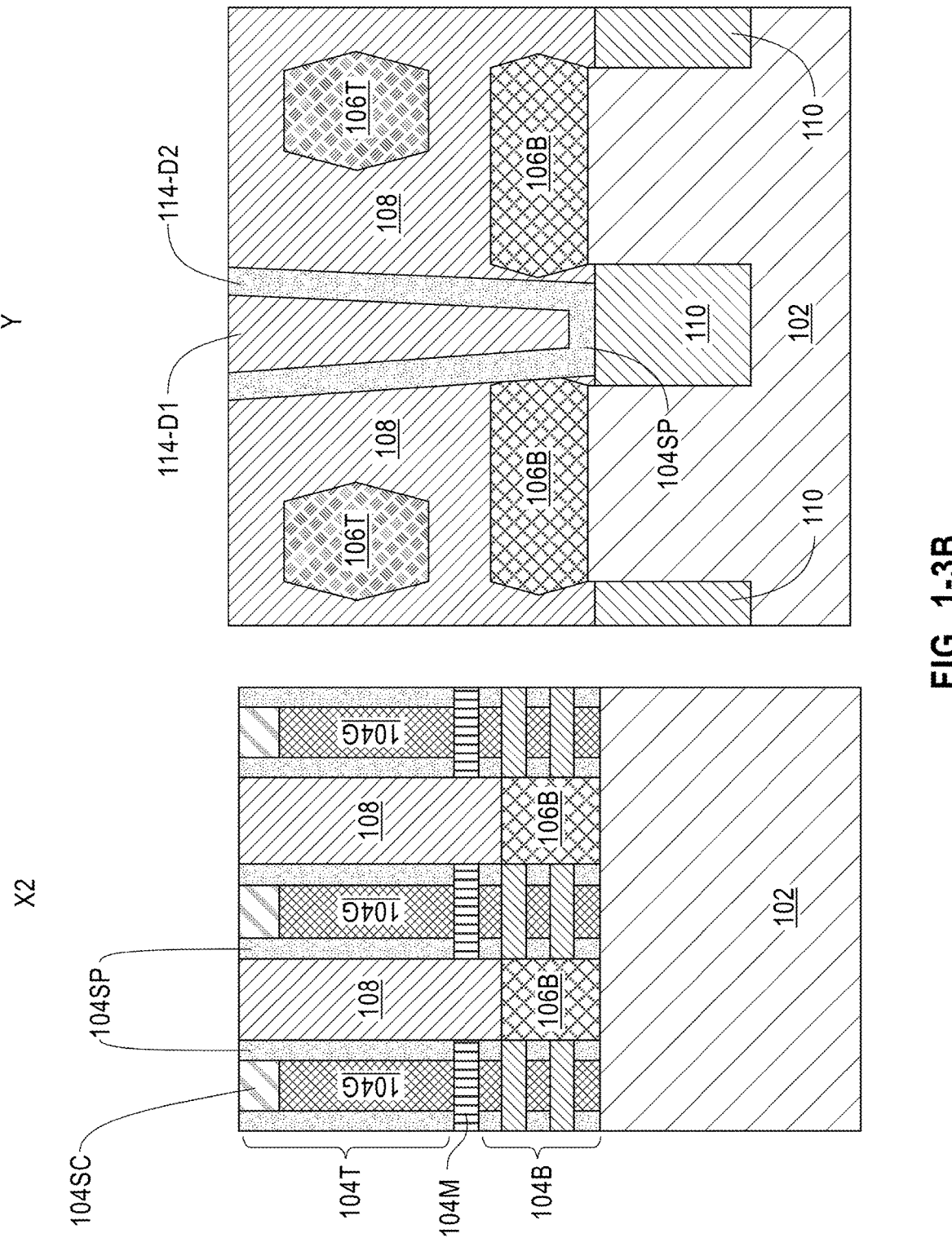

FIG. 3 is a top view of cells 300-1, 300-2 having bottom contact jumpers of stacked FET semiconductors, in accordance with some embodiments of the present disclosure. The cells 300-1, 300-2, can represent example cells of the semiconductor structure shown in FIGS. 1-9A, 1-9B. The cell 300-1 represents a single height cell, wherein a contact fly-over connects the source of a first device (using a bottom contact jumper) to the drain of the first device, and the source of a second device. Additionally, the cell 300-2 represent a double height cell, wherein the contact fly-over connects the source of a bottom device (using a bottom contact jumper) to a drain of a top device in another cell.

Figures 1, 2, 3, 4, 4A:
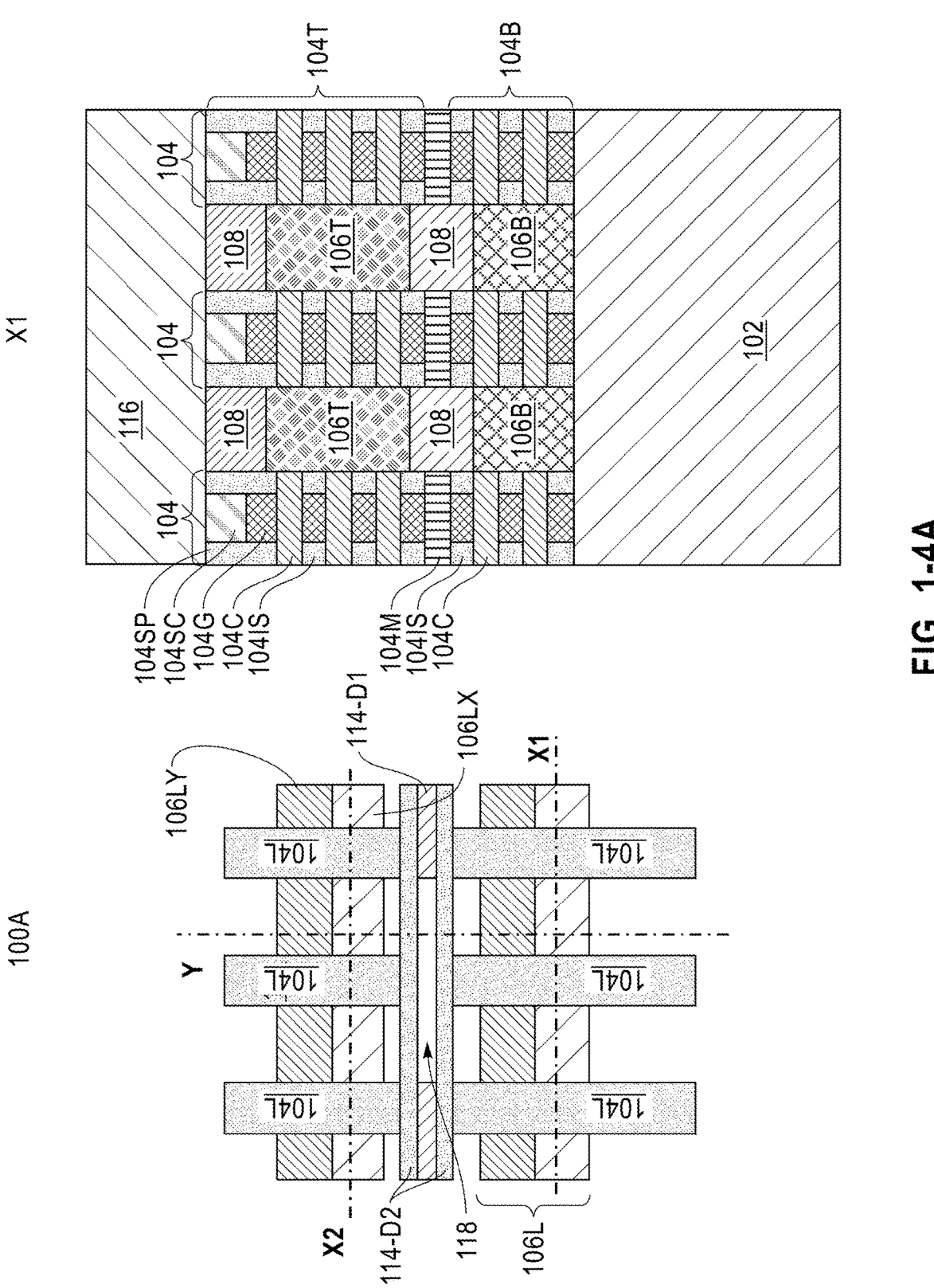
Figures 1, 2, 3, 4, 4B:
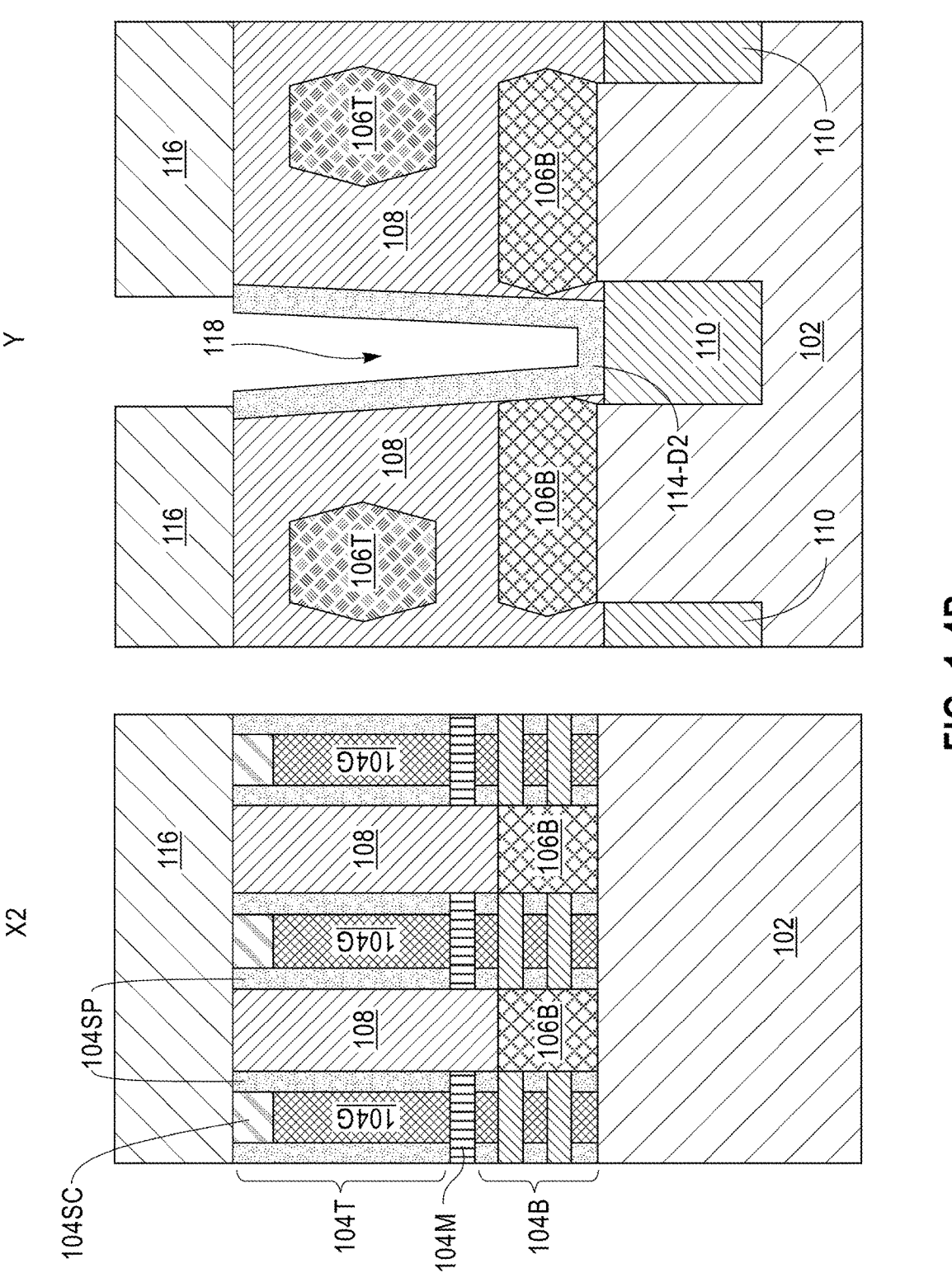
Figures 1, 2, 3, 4, 5, 5A:
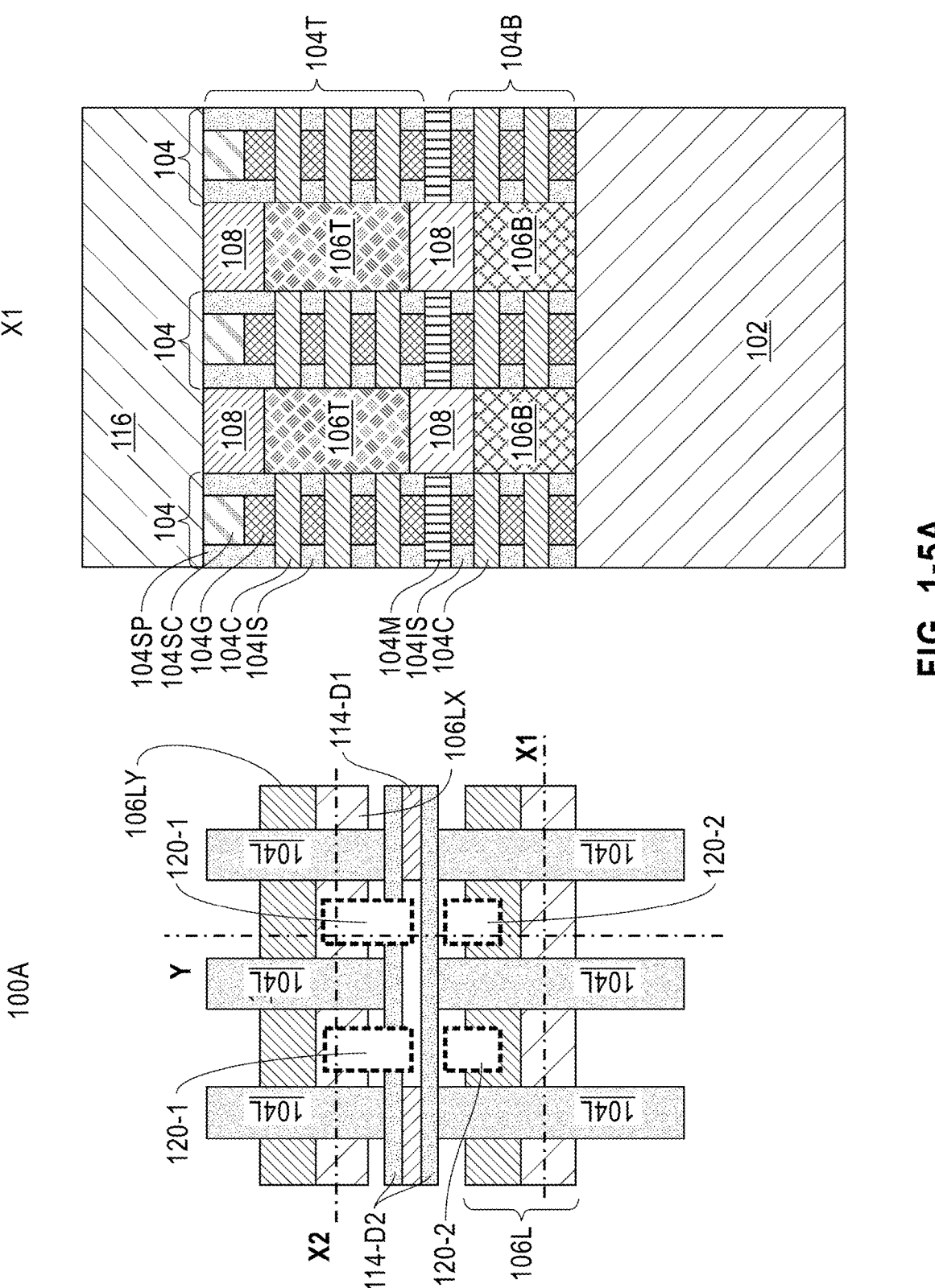
Figures 1, 2, 3, 4, 5, 5B:
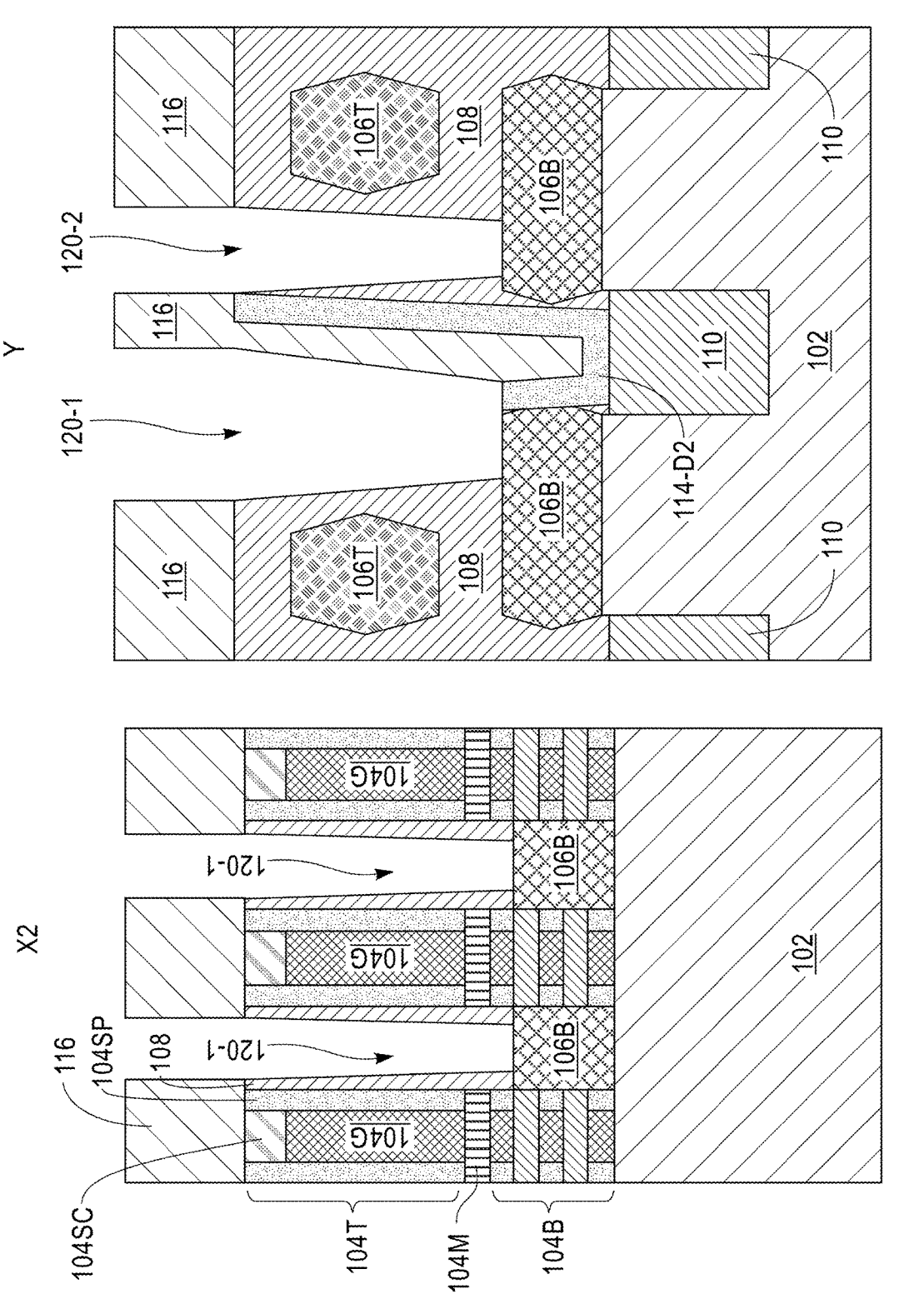
Figures 1, 2, 3, 4, 5, 6, 6A:
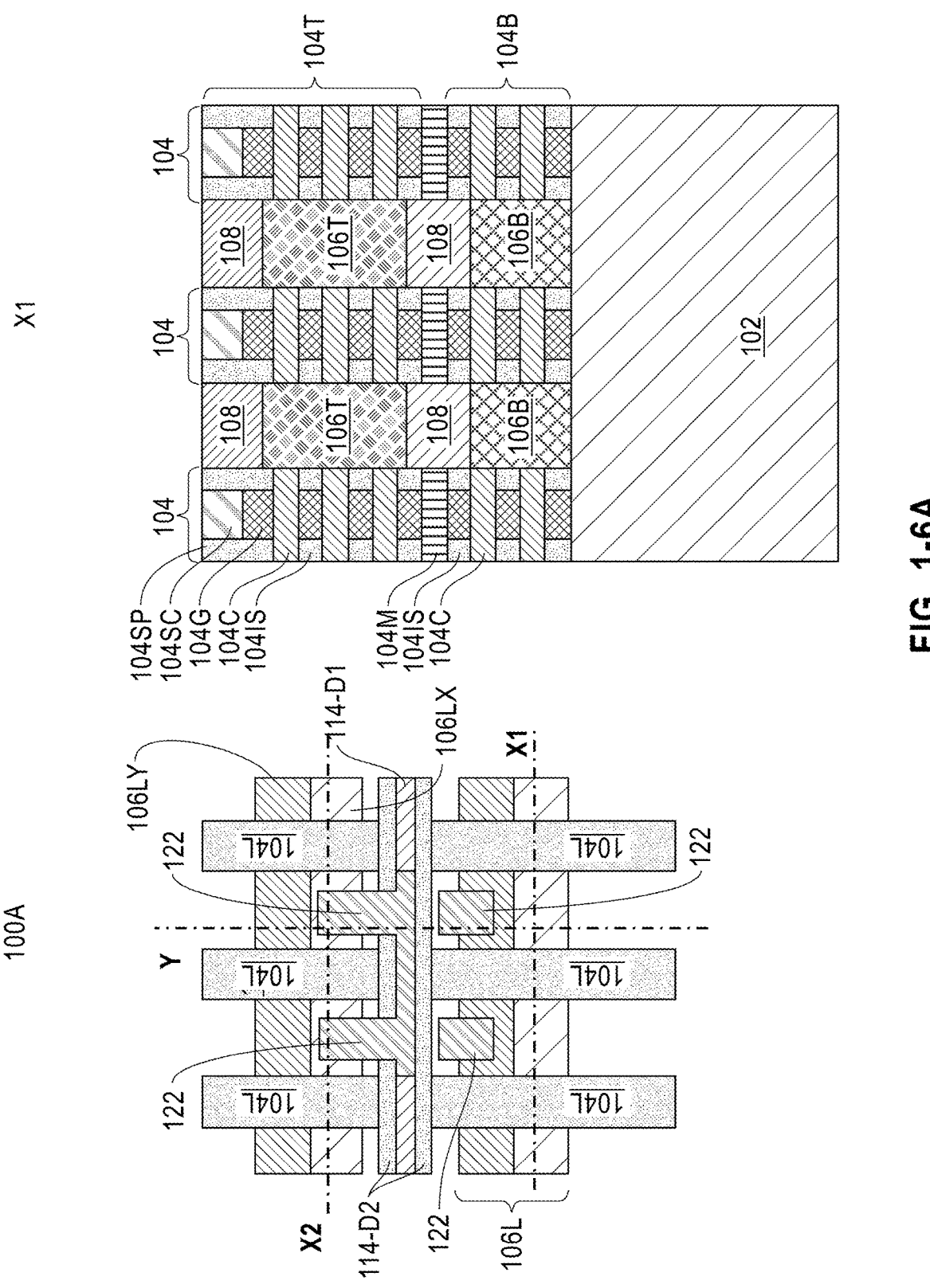
Figures 1, 2, 3, 4, 5, 6, 6B:
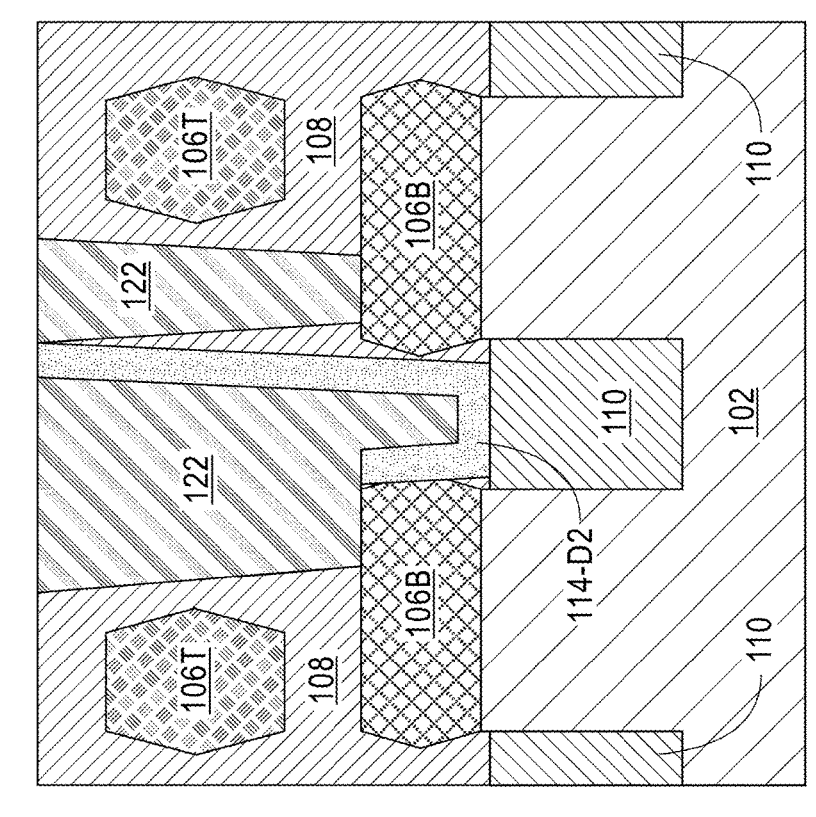
Figures 1, 2, 3, 4, 5, 6, 7, 7A:
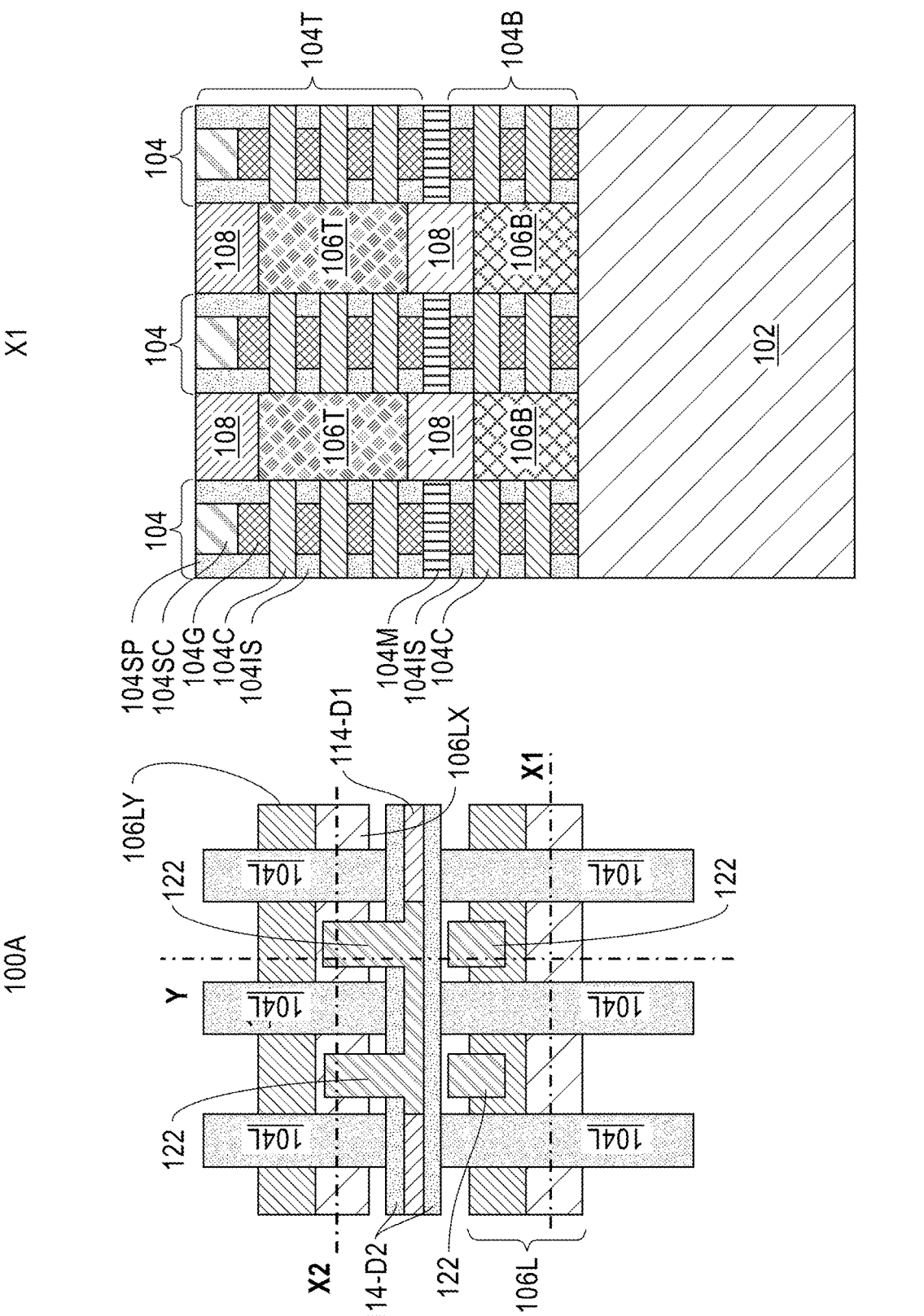
Figures 1, 2, 3, 4, 5, 6, 7, 7B:
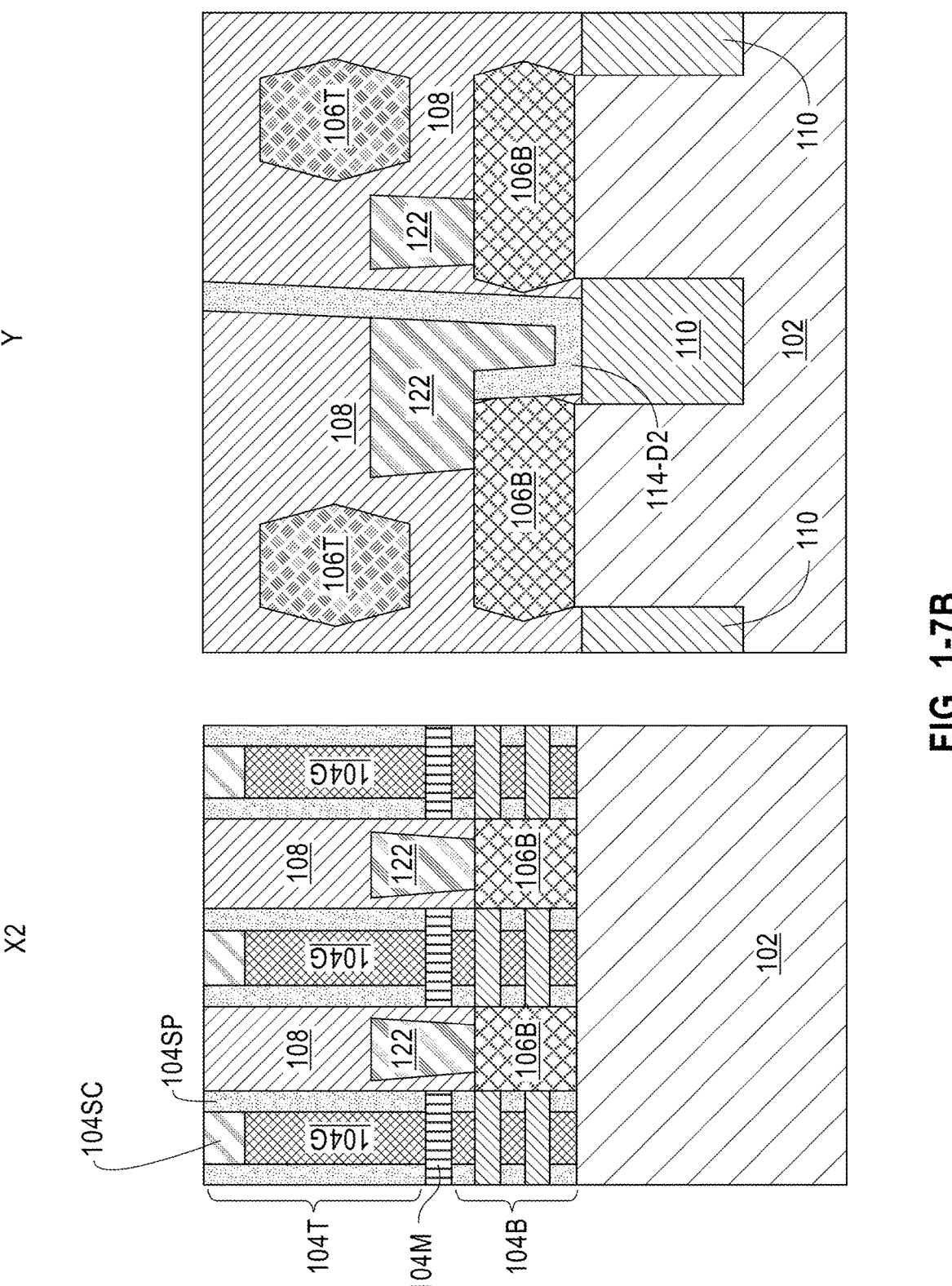
Figures 1, 2, 3, 4, 5, 6, 7, 8, 8A:
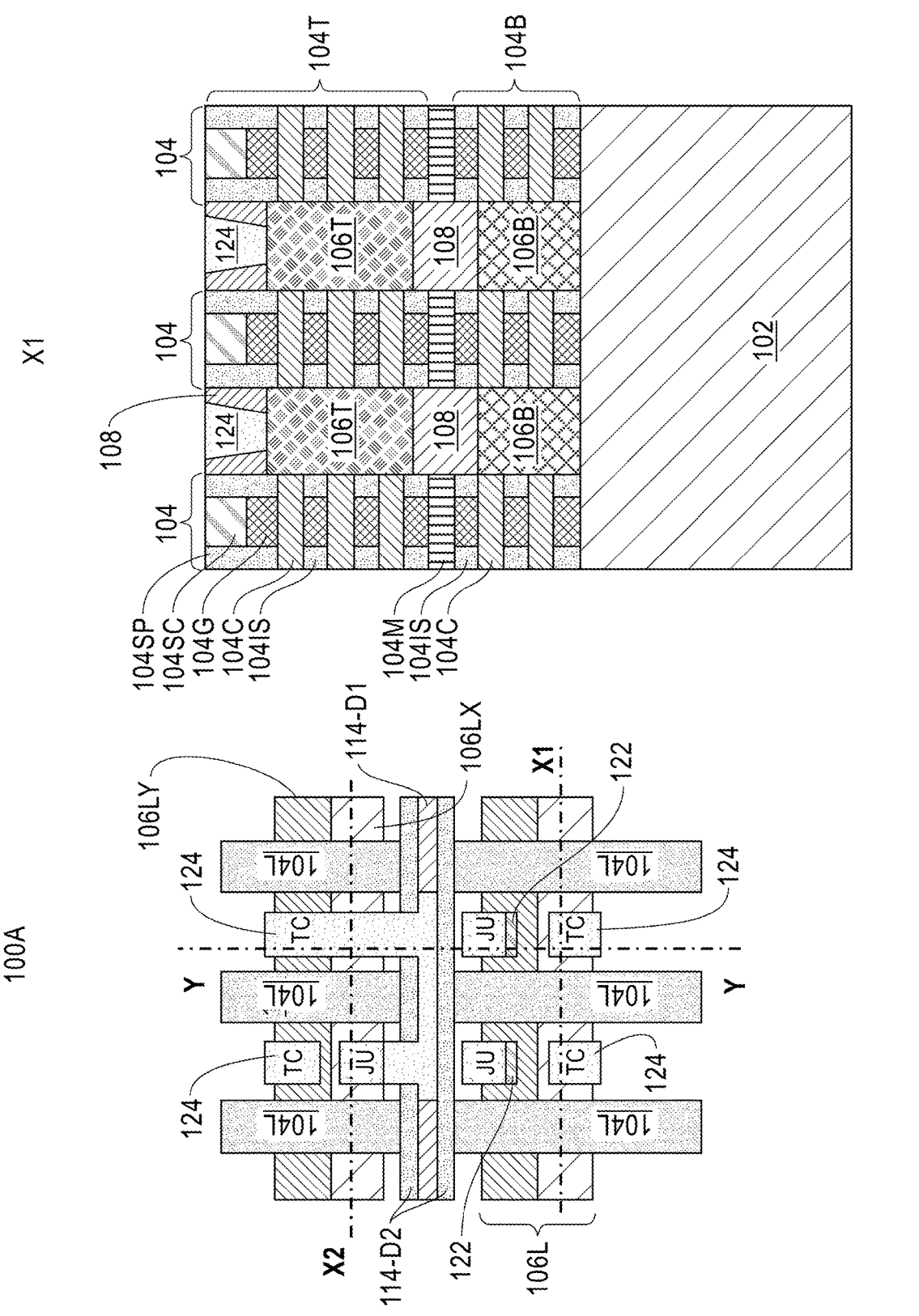
Figures 1, 2, 3, 4, 5, 6, 7, 8, 9, 9A:
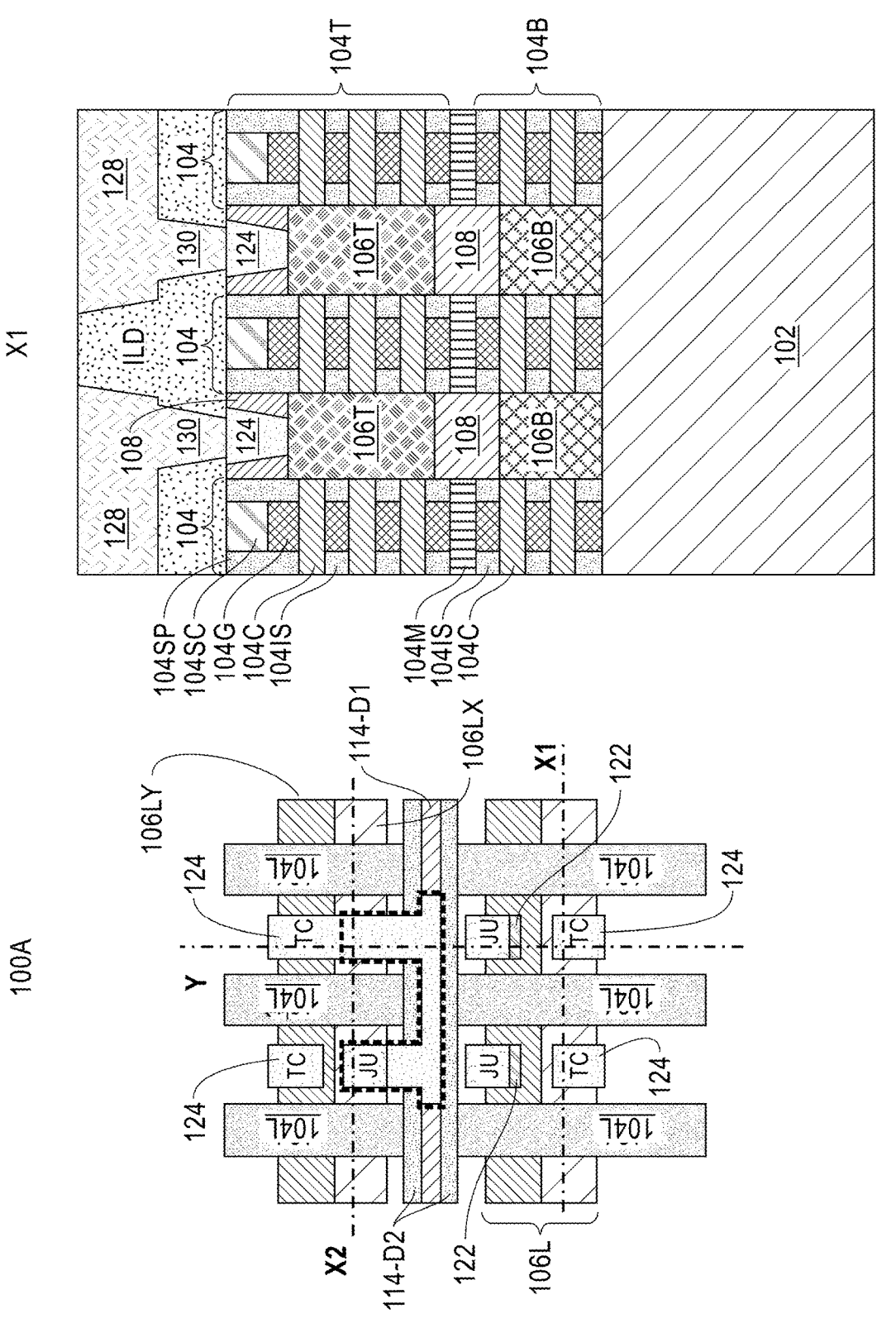
Figures 1, 2, 3, 4, 5, 6, 7, 8, 9, 9B:
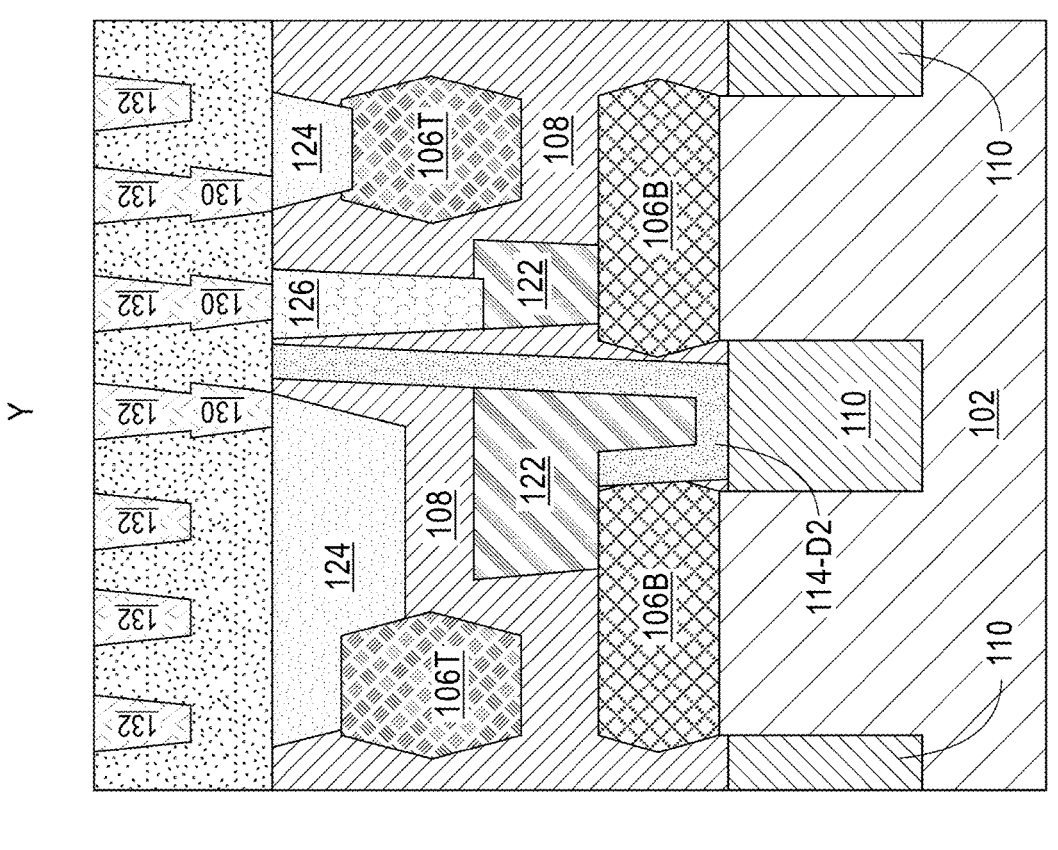
Figure 2:
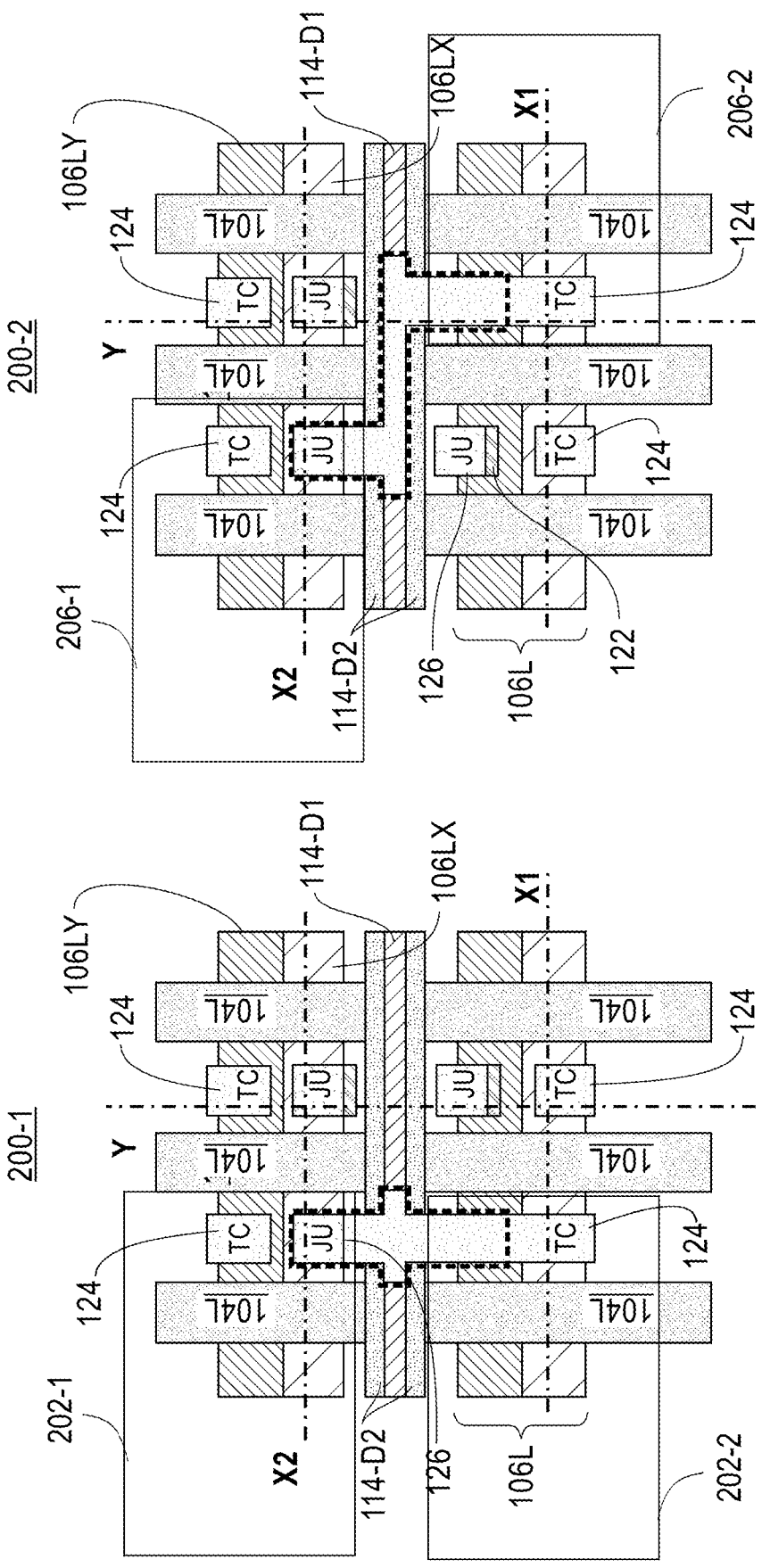
Figure 3:
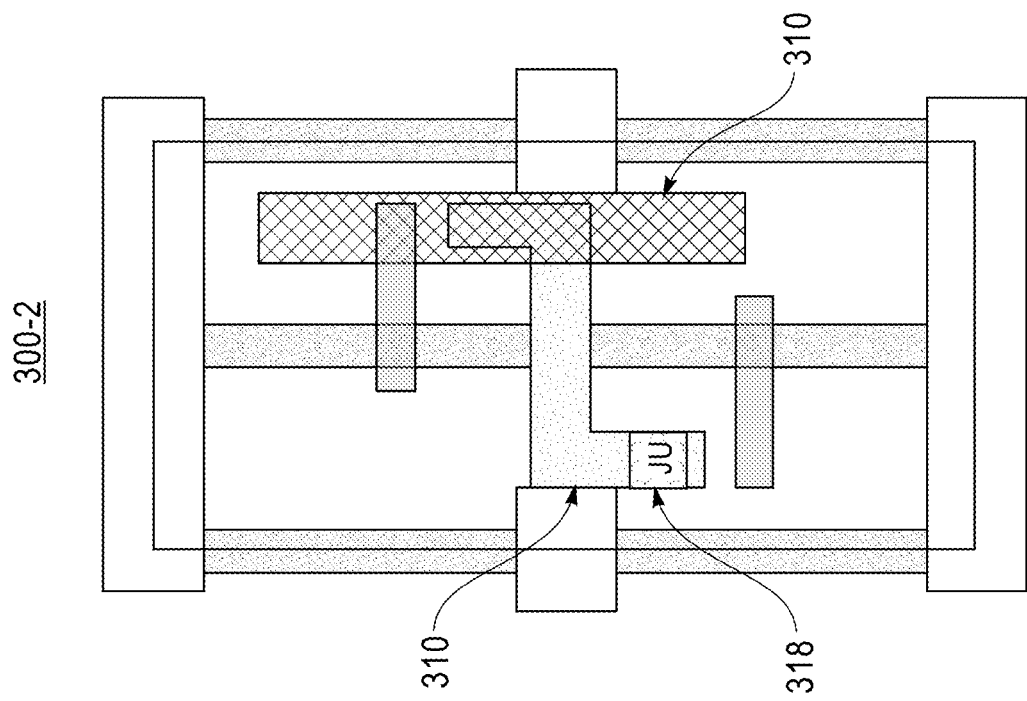
Figure 3:
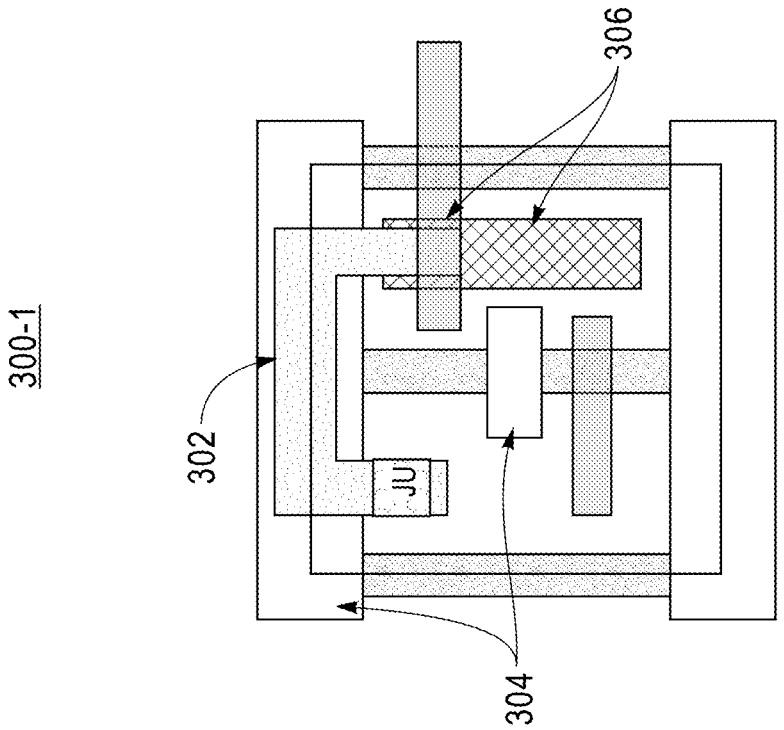

FIG. 4 is a process flow chart of a method 400 for forming bottom contact jumpers of stacked FET semiconductors, in accordance with some embodiments of the present disclosure. The method 400 may be similar to the method represented in FIGS. 1-1 through 1-9, to produce a semiconductor structure.

At operation 402, a fabrication tool can perform a gate cut, described with respect to FIG. 1-2. As stated previously, performing a gate cut involves removing ILD, such as ILD 108, to form a trench, such as, trench 112.

At operation 404, a fabrication tool may deposit bi-layer dielectric material, described with respect to FIG. 1-3. As stated previously, depositing bi-layer dielectric material involves depositing dielectrics, such as, dielectrics 114-D1, 114-D2 in the trench 112. The dielectric 114-D1 can be silicon oxide ($SiO_2$). Additionally, the dielectric 114-D2 can be silicon nitride (SiN).

At operation 406, a fabrication tool can perform bottom contact jumper patterning, described with respect to FIG. 1-4. As stated previously, performing bottom contact jumper patterning involves depositing an OPL, such as OPL 116, removing portions of the OPL 116 and dielectric 114-D1 to form trench 118. According to some embodiments of the present disclosure, removing the OPL 116 and dielectric 114-D1 can involve a self-aligned oxide RIE process.

At operation 408, a fabrication tool can perform bottom contact patterning, described with respect to FIG. 1-5. As stated previously, performing bottom contact patterning involves removing portions of the OPL 116, ILD 108, and dielectric 114-2 to form trenches, such as trenches 120-1, 120-2.

At operation 410, a fabrication tool can perform bottom contact metallization on the semiconductor structure shown in FIG. 1-6. As stated previously, performing bottom contact metallization involves depositing metallic materials in the trenches 120-1, 120-2, to form bottom contact metals, such as bottom contact metals 122-1.

At operation 412, a fabrication tool can perform a bottom contact recess, ILD fill, and chemical mechanical planarization (CMP), described with respect to FIG. 1-7. As stated previously, performing the bottom contact recess involves removing material from the bottom contact metals 122-1 to form bottom contacts, such as the bottom contacts 122. Additionally, performing the ILD fill involves depositing ILD 108 on the bottom contacts 122. Further, performing the CMP involves removing portions of the ILD fill to form a planarized surface for the ILD fill with the rest of the semiconductor structure.

At operation 414, a fabrication tool can form top contacts 124 and bottom contact jumper 126, described with respect to FIG. 1-8. As stated previously, forming the top contacts 124 and bottom contact jumper 126 involves removing ILD 108 to form trenches for holding the top contacts 126 and bottom contact jumper 126. Additionally, forming the top contacts 124 and bottom contact jumper 126 involves depositing a metallic material that constitutes the top contacts 126 and bottom contact jumper 126.

At operation 416, a fabrication tool can deposit ILD material, perform Mx metal layer patterning, and perform metal layer metallization, described with respect to FIG. 1-9. As stated previously, depositing ILD material may involve depositing a dielectric material to form the ILD 128. Additionally, performing Mx metal layer patterning can involve removing portions of the ILD 128 to form patterns for the metal lines and contacts. Further, performing the metal layer metallization can involve depositing metal material in the openings created by removing the ILD portions, to form metal line M1 130, and vias 132.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks. When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category. For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations. Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to one skilled in the art. Therefore, it is intended that the following claims be interpreted as covering all such alterations and modifications as fall within the true spirit and scope of the invention.

A non-limiting list of examples are provided hereinafter to demonstrate some aspects of the present disclosure.

Example 1 is a semiconductor structure. The semiconductor structure includes a stacked field effect transistor (FET) comprising a top FET and a bottom FET; a bottom source/drain (S/D) contact jumper connection disposed within a gate cut region, wherein the gate cut region comprises a first liner spacer and a dielectric fill disposed within the first liner spacer, and wherein the bottom S/D contact jumper is formed within the dielectric fill; a top S/D contact fly-over disposed over a bottom S/D contact in contact with the bottom S/D contact jumper; a top S/D access metal track disposed over the bottom S/D contact through the top S/D contact; a first gate cut liner facing the top S/D contact fly-over, wherein the first gate cut liner is recessed; and a second gate cut liner facing a non-fly-over top S/D contact, wherein the second gate cut liner is not recessed.

Example 2 includes the semiconductor structure of example 1, including or excluding optional features. In this example, the semiconductor structure includes a single height cell comprising the stacked FET, wherein the top S/D contact fly-over connects a first source of a top FET of the stacked FET, using the bottom S/D contact jumper, to: a drain of the stacked FET; and a second source of a second device.

Example 3 includes the semiconductor structure of any one of examples 1 to 2, including or excluding optional features. In this example, the semiconductor structure includes a double height cell comprising the stacked FET, wherein the top S/D contact fly-over connects a first source of a bottom FET of the stacked FET, using the bottom S/D contact jumper, to a second drain of a top FET of a second stacked FET.

Example 4 includes the semiconductor structure of any one of examples 1 to 3, including or excluding optional features. In this example, the top S/D contact fly-over connects the bottom contact jumper of a first cell of the semiconductor structure to a bottom contact jumper of a second cell disposed in a same device layer of the first cell.

Example 5 includes the semiconductor structure of any one of examples 1 to 4, including or excluding optional features. In this example, the top S/D contact fly-over connects the bottom contact jumper of a first cell of the semiconductor structure to a bottom contact jumper of a second cell disposed in a different device layer from the first cell.

Example 6 includes the semiconductor structure of any one of examples 1 to 5, including or excluding optional features. In this example, the contact fly-over is disposed over, and in contact with, a top S/D epitaxial of the stacked FET.

Example 7 includes the semiconductor structure of any one of examples 1 to 6, including or excluding optional features. In this example, the bottom S/D contact is disposed in contact with the second gate cut liner.

Example 8 is a semiconductor structure. The semiconductor structure includes a stacked field effect transistor (FET) comprising a top FET and a bottom FET; a bottom source/drain (S/D) contact jumper connection disposed within a gate cut region, wherein the gate cut region comprises a first liner spacer and a dielectric fill disposed within the first liner spacer, and wherein the bottom S/D contact jumper is formed within the dielectric fill; a top S/D contact fly-over disposed over a bottom S/D contact in contact with the bottom S/D contact jumper; a top S/D access metal track disposed over the bottom S/D contact through the top S/D contact; a first gate cut liner facing the top S/D contact fly-over, wherein the first gate cut liner is recessed; and a second gate cut liner facing a non-fly-over top S/D contact, wherein the second gate cut liner is partially recessed.

Example 9 includes the semiconductor structure of example 8, including or excluding optional features. In this example, the semiconductor structure includes a single height cell comprising the stacked FET, wherein the top S/D contact fly-over connects a first source of a top FET of the stacked FET, using the bottom S/D contact jumper, to: a drain of the stacked FET; and a second source of a second device.

Example 10 includes the semiconductor structure of any one of examples 8 to 9, including or excluding optional features. In this example, the semiconductor structure includes a double height cell comprising the stacked FET, wherein the top S/D contact fly-over connects a first source of a bottom FET of the stacked FET, using the bottom S/D contact jumper, to a second drain of a top FET of a second stacked FET.

Example 11 includes the semiconductor structure of any one of examples 8 to 10, including or excluding optional features. In this example, the contact fly-over connects the bottom contact jumper of a first cell of the semiconductor structure to a bottom contact jumper of a second cell disposed in a same device layer of the first cell.

Example 12 includes the semiconductor structure of any one of examples 8 to 11, including or excluding optional features. In this example, the contact fly-over connects the bottom contact jumper of a first cell of the semiconductor structure to a bottom contact jumper of a second cell disposed in a different device layer from the first cell.

Example 13 includes the semiconductor structure of any one of examples 8 to 12, including or excluding optional features. In this example, the contact fly-over is disposed over, and in contact with, a top S/D epitaxial of the stacked FET.

Example 14 includes the semiconductor structure of any one of examples 8 to 13, including or excluding optional features. In this example, the bottom S/D contact is disposed in contact with the second gate cut liner.

Example 15 is a method for fabricating a semiconductor structure, the method. The method includes forming a top field effect transistor (FET) comprising a top gate, over a bottom FET comprising a bottom gate, wherein the top FET is in contact with a top source/drain (S/D) epitaxial, and wherein the bottom FET is in contact with a bottom S/D epitaxial; forming a cut region at a boundary to a cell comprising the top FET and bottom FET; forming a first liner spacer in the cut region; perform a dielectric fill in the first liner spacer; forming a bottom S/D contact jumper in the dielectric fill; forming a bottom S/D contact with a contact recess; and forming a top S/D contact fly-over over the bottom S/D contact, wherein the bottom S/D contact is in contact with the bottom S/D contact jumper.

Example 16 includes the method of example 15, including or excluding optional features. In this example, the method includes forming a plurality of additional vias. Optionally, the method includes forming a plurality of metal lines in contact with one of the plurality of additional vias, wherein the one via connects the plurality of metal lines to the top S/D contact. Optionally, the top S/D contact fly-over connects a first source of the top FET, using the bottom S/D contact jumper, to: a drain of the top FET; and a second source of a second device. Optionally, the top S/D contact fly-over connects a first source of a bottom FET associated with the top FET, using the bottom S/D contact jumper, to a second drain of a top FET of a stacked FET. Optionally, the top S/D contact fly-over connects the bottom contact jumper of a first cell of the semiconductor structure to a bottom contact jumper of a second cell disposed in a same device layer of the first cell.

What is claimed is:

1. A semiconductor structure comprising:
   a stacked field effect transistor (FET) comprising a top FET and a bottom FET;

a bottom source/drain (S/D) contact jumper connection disposed within a gate cut region, wherein the gate cut region comprises a first liner spacer and a dielectric fill disposed within the first liner spacer, and wherein the bottom S/D contact jumper is formed within the dielectric fill;
   a top S/D contact fly-over disposed over a bottom S/D contact in contact with the bottom S/D contact jumper;
   a top S/D access metal track disposed over the bottom S/D contact through the top S/D contact;
   a first gate cut liner facing the top S/D contact fly-over, wherein the first gate cut liner is recessed; and
   a second gate cut liner facing a non-fly-over top S/D contact, wherein the second gate cut liner is not recessed.

2. The semiconductor structure of claim 1, further comprising a single height cell comprising the stacked FET, wherein the top S/D contact fly-over connects a first source of a top FET of the stacked FET, using the bottom S/D contact jumper, to:
   a drain of the stacked FET; and
   a second source of a second device.

3. The semiconductor structure of claim 1, further comprising a double height cell comprising the stacked FET, wherein the top S/D contact fly-over connects a first source of a bottom FET of the stacked FET, using the bottom S/D contact jumper, to a second drain of a top FET of a second stacked FET.

4. The semiconductor structure of claim 1, wherein the top S/D contact fly-over connects the bottom contact jumper of a first cell of the semiconductor structure to a bottom contact jumper of a second cell disposed in a same device layer of the first cell.

5. The semiconductor structure of claim 1, wherein the top S/D contact fly-over connects the bottom contact jumper of a first cell of the semiconductor structure to a bottom contact jumper of a second cell disposed in a different device layer from the first cell.

6. The semiconductor structure of claim 1, wherein the contact fly-over is disposed over, and in contact with, a top S/D epitaxial of the stacked FET.

7. The semiconductor structure of claim 1, wherein the bottom S/D contact is disposed in contact with the second gate cut liner.

8. A semiconductor structure comprising:
   a stacked field effect transistor (FET) comprising a top FET and a bottom FET;
   a bottom source/drain (S/D) contact jumper connection disposed within a gate cut region, wherein the gate cut region comprises a first liner spacer and a dielectric fill disposed within the first liner spacer, and wherein the bottom S/D contact jumper is formed within the dielectric fill;
   a top S/D contact fly-over disposed over a bottom S/D contact in contact with the bottom S/D contact jumper;
   a top S/D access metal track disposed over the bottom S/D contact through the top S/D contact;
   a first gate cut liner facing the top S/D contact fly-over, wherein the first gate cut liner is recessed; and
   a second gate cut liner facing a non-fly-over top S/D contact, wherein the second gate cut liner is partially recessed.

9. The semiconductor structure of claim 8, further comprising a single height cell comprising the stacked FET, wherein the top S/D contact fly-over connects a first source of a top FET of the stacked FET, using the bottom S/D contact jumper, to:

a drain of the stacked FET; and a second source of a second device.

10. The semiconductor structure of claim 8, further comprising a double height cell comprising the stacked FET, wherein the top S/D contact fly-over connects a first source of a bottom FET of the stacked FET, using the bottom S/D contact jumper, to a second drain of a top FET of a second stacked FET.

11. The semiconductor structure of claim 8, wherein the contact fly-over connects the bottom contact jumper of a first cell of the semiconductor structure to a bottom contact jumper of a second cell disposed in a same device layer of the first cell.

12. The semiconductor structure of claim 8, wherein the contact fly-over connects the bottom contact jumper of a first cell of the semiconductor structure to a bottom contact jumper of a second cell disposed in a different device layer from the first cell.

13. The semiconductor structure of claim 8, wherein the contact fly-over is disposed over, and in contact with, a top S/D epitaxial of the stacked FET.

14. The semiconductor structure of claim 8, wherein the bottom S/D contact is disposed in contact with the second gate cut liner.

15. A method for fabricating a semiconductor structure, the method comprising:

forming a top field effect transistor (FET) comprising a top gate, over a bottom FET comprising a bottom gate, wherein the top FET is in contact with a top source/ drain (S/D) epitaxial, and wherein the bottom FET is in contact with a bottom S/D epitaxial;

forming a cut region at a boundary to a cell comprising the top FET and bottom FET;

forming a first liner spacer in the cut region;

perform a dielectric fill in the first liner spacer;

forming a bottom S/D contact jumper in the dielectric fill;

forming a bottom S/D contact with a contact recess; and forming a top S/D contact fly-over over the bottom S/D contact, wherein the bottom S/D contact is in contact with the bottom S/D contact jumper.

16. The method of claim 15, further comprising forming a plurality of additional vias.

17. The method of claim 16, further comprising forming a plurality of metal lines in contact with one of the plurality of additional vias, wherein the one via connects the plurality of metal lines to the top S/D contact.

18. The method of claim 17, wherein the top S/D contact fly-over connects a first source of the top FET, using the bottom S/D contact jumper, to:

a drain of the top FET; and a second source of a second device.

19. The method of claim 18, wherein the top S/D contact fly-over connects a first source of a bottom FET associated with the top FET, using the bottom S/D contact jumper, to a second drain of a top FET of a stacked FET.

20. The method of claim 16, wherein the top S/D contact fly-over connects the bottom contact jumper of a first cell of the semiconductor structure to a bottom contact jumper of a second cell disposed in a same device layer of the first cell.

\* \* \* \* \*